(12) United States Patent
Sen et al.

(10) Patent No.: US 12,212,330 B2
(45) Date of Patent: Jan. 28, 2025

(54) POWER SUPPLY AND SETPOINT VOLTAGE GENERATION

(71) Applicant: Infineon Technologies Austria AG, Villach (AT)

(72) Inventors: Sujata Sen, Marina Del Rey, CA (US); Luca Petruzzi, Andover, MA (US); Aviral Srivastava, Los Angeles, CA (US)

(73) Assignee: Infineon Technologies Austria AG, Villach (AT)

( * ) Notice: Subject to any disclaimer, the term of this patent is extended or adjusted under 35 U.S.C. 154(b) by 182 days.

(21) Appl. No.: 17/954,569

(22) Filed: Sep. 28, 2022

(65) Prior Publication Data
US 2024/0113718 A1    Apr. 4, 2024

(51) Int. Cl.
*H03M 1/06*    (2006.01)

(52) U.S. Cl.
CPC .............................. *H03M 1/0607* (2013.01)

(58) Field of Classification Search
CPC ....... H03M 1/0607; H03M 1/747; H03M 1/06
USPC ....................................................... 341/118
See application file for complete search history.

(56) References Cited

U.S. PATENT DOCUMENTS

| 6,020,728 A * | 2/2000 | Thus ................ G05F 3/265 |
| | | 323/273 |
| 6,528,981 B1 * | 3/2003 | Tsubaki .................. H03F 3/345 |
| | | 323/315 |
| 7,449,873 B2 | 11/2008 | Schaffer et al. |
| 7,916,058 B1 | 3/2011 | Balachandran |
| 2006/0255787 A1 * | 11/2006 | Schaffer ................. G05F 3/262 |
| | | 323/315 |

FOREIGN PATENT DOCUMENTS

WO    2021054629 A1    3/2021

OTHER PUBLICATIONS

Extended European Search Report, EP 23 20 0097, Mar. 7, 2024, pp. 1-13.

* cited by examiner

*Primary Examiner* — Jean B Jeanglaude
(74) *Attorney, Agent, or Firm* — Armis IP Law, LLC

(57) ABSTRACT

Digital-to-analog converter circuitry includes sequence of multiple current drive modules. The sequence may include a first current drive module and a second current drive module of a digital-to-analog converter. The first current drive module is switchable between: i) a first mode of producing a first reference current that is mirrored by a second current drive module coupled to the first current drive module; and ii) a second mode of mirroring a second reference current that is produced by the second current drive module or a third current drive module coupled to the first current drive module.

25 Claims, 14 Drawing Sheets

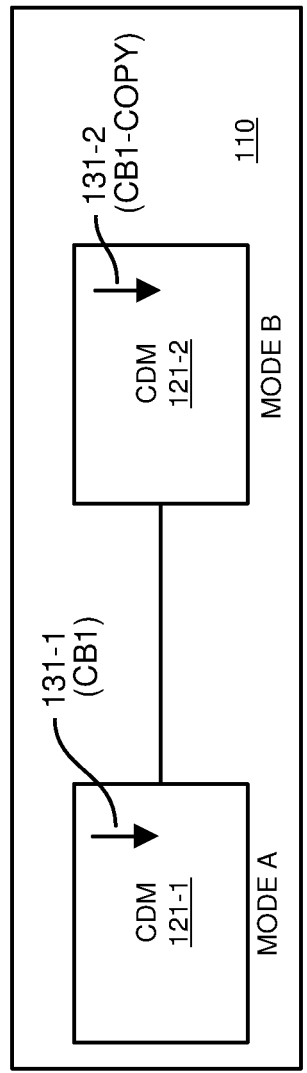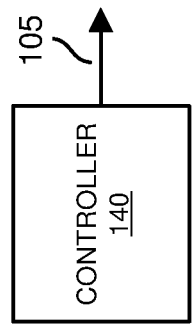
FIG. 1A
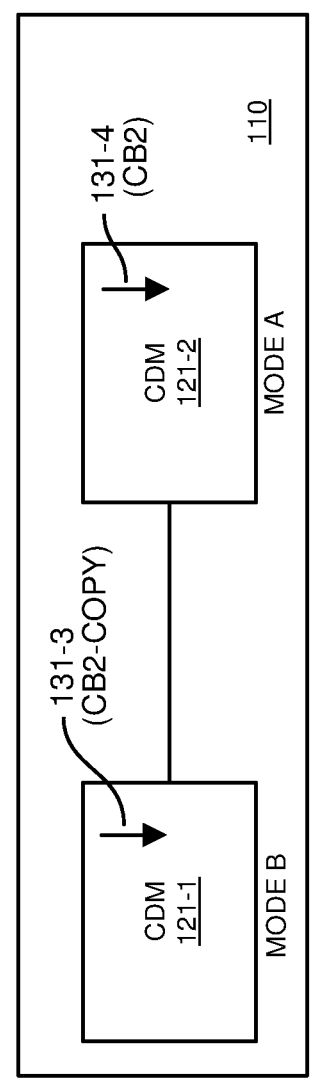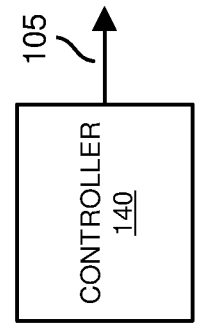
FIG. 1B

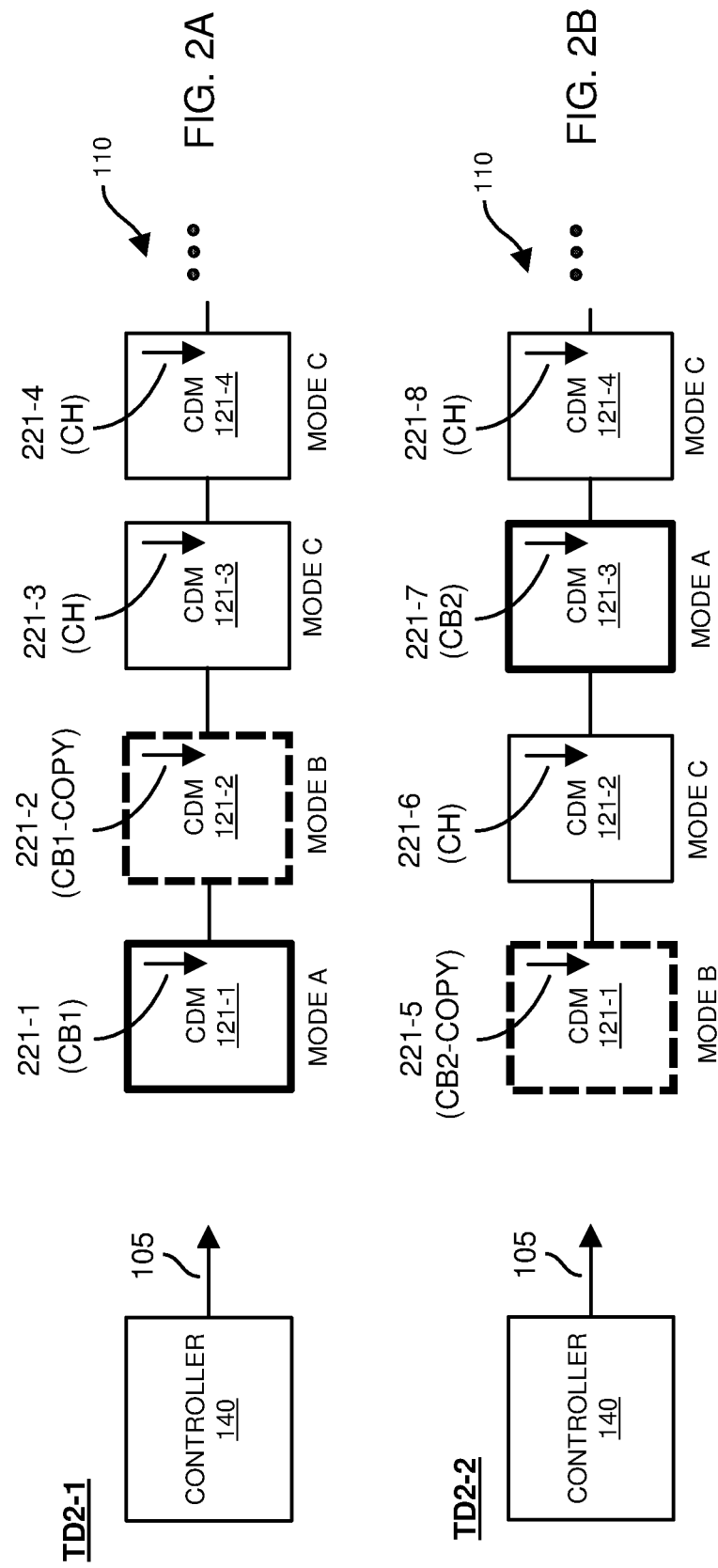

FIG. 8

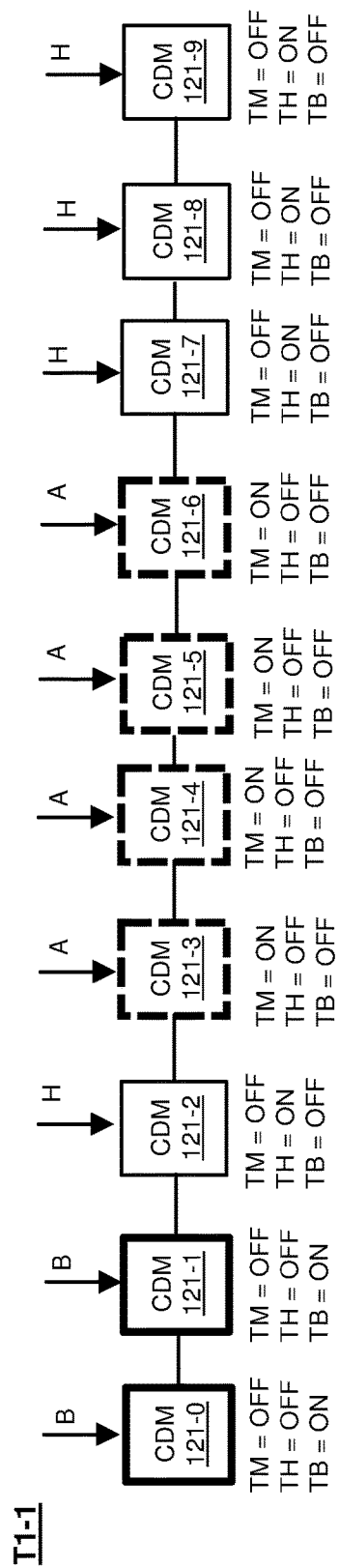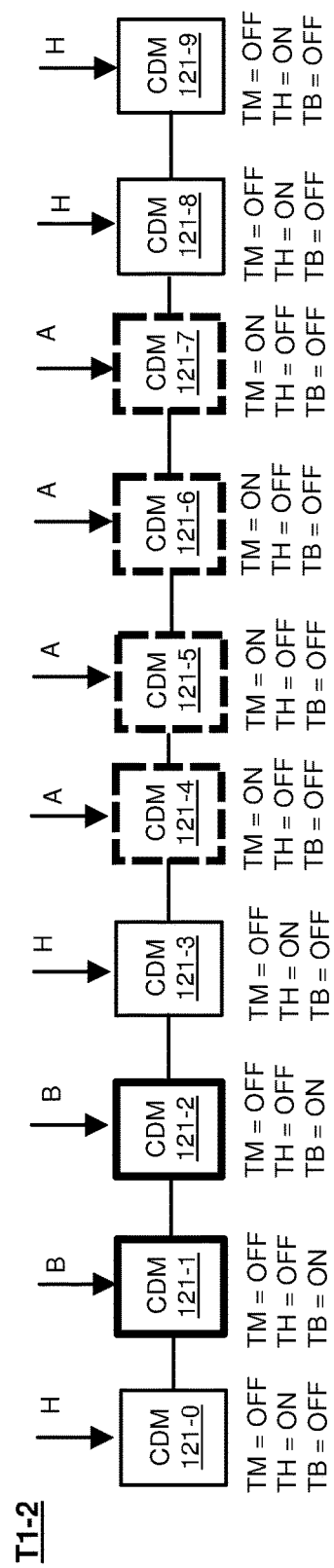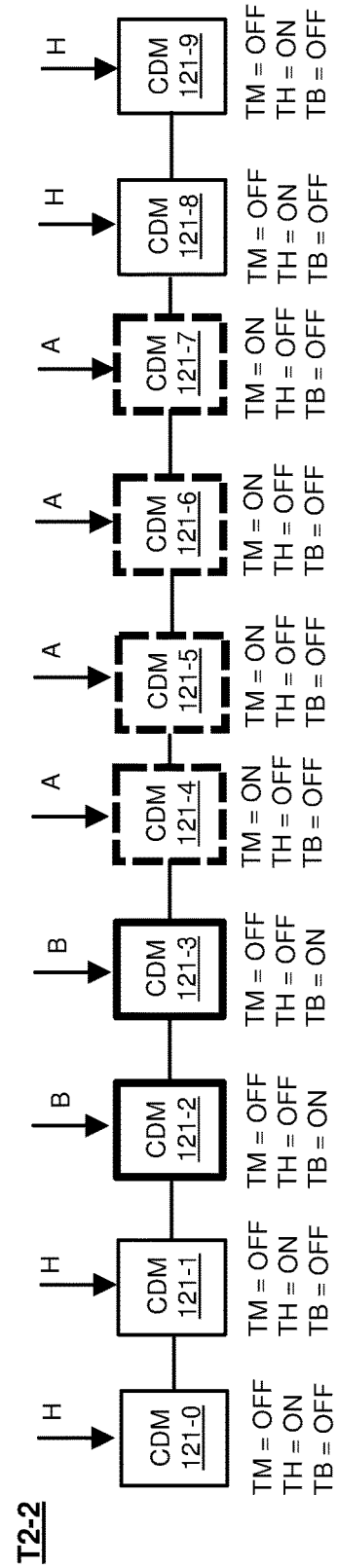
FIG. 9

POWER SUPPLY AND SETPOINT VOLTAGE GENERATION

BACKGROUND

One type of conventional power converter is a voltage regulator. In general, to maintain an output voltage within a desired range, a controller in the voltage regulator compares the magnitude of a generated output voltage to a setpoint reference voltage. Based on a respective error voltage derived from the comparison, the controller modifies a respective switching frequency and/or pulse width modulation associated with activating high side switch circuitry and low side switch circuitry in the voltage regulator.

Typically, a power supply controller regulates a respective output voltage of a power supply based on a desired setpoint reference voltage. Conventional power converters can be configured to receive a voltage value (such as a so-called VID value) indicating a desired output voltage setting. The VID voltage value may vary over time depending on system operation. The conventional voltage regulator uses the VID value as the setpoint reference voltage. Accordingly, a device generating the VID value is able to control a magnitude of the output voltage.

Conventional control techniques can be configured to implement techniques such as i) device matching and optimal layout technique to achieve minimal drift; and ii) Offset trimmed at one setpoint voltage; Gain trimmed at two setpoint voltages. However, such techniques typically are not able to meet the future requirements for reference voltage setpoint accuracy.

BRIEF DESCRIPTION

Implementation of clean energy (or green technology) is very important to reduce human impact on the environment. In general, clean energy includes any evolving methods and materials to reduce an overall toxicity on the environment from energy consumption.

This disclosure includes the observation that raw energy, such as received from green energy sources or non-green energy sources, typically needs to be converted into an appropriate form (such as desired AC voltage, DC voltage, etc.) before it can be used to power end devices such as servers, computers, mobile communication devices, wireless base stations, etc. In certain instances, energy is stored in a respective one or more battery resource. Alternatively, energy is received from a voltage generator or voltage source.

Regardless of whether energy is received from green energy sources or non-green energy sources, it is desirable to make most efficient use of raw energy (such as storage and subsequent distribution) provided by such sources to reduce our impact on the environment. This disclosure contributes to reducing our carbon footprint and providing better use of energy via more efficient energy conversion.

This disclosure further includes the observation that conventional implementation of setpoint reference voltage generators suffer from deficiencies such as:

Conventional setpoint reference voltage generators typically provide low setpoint accuracy over temperature and lifetime;

Due to device drift caused by lifetime and package stress, there is typically a mismatch of integrated circuit components causing setpoint reference voltage to drift;

Isolated converter applications requiring current sharing between voltage regulators require highly matched setpoints between the regulators; conventional voltage regulator controllers suffer from drift of setpoint which was mostly a gain drift;

A Voltage Sensor for a controller of a DCDC converter consists of a tracking ADC which digitizes the error between the input voltage and DAC using a loop comparator;

The DAC of the tracking ADC consists of a current steering DAC (IDAC) whose gain is set to match the resolution required for the output voltage. The gain drift of the Voltage Sensor ADC is due to a drift in the IDAC reference current Secondary sources of drift occur when the cells of the DAC drift relative to each other Embodiments herein include novel ways of providing a more accurate setpoint reference voltages in which to control regulation of an output voltage. For example, the techniques as discussed herein include mirrored cells of a DAC used in a Voltage Sense ADC will have a dynamic element matching feature where cells assigned as bias cells are shuffled with cells assigned as output cells—this feature improves overall linearity and also improves gain and offset drift over temperature and lifetime More specifically, embodiments herein include an apparatus comprising: a first current drive module of a digital-to-analog converter. The first current drive module is switchable between: i) a first mode of producing a first reference current that is mirrored by a second current drive module coupled to the first current drive module; and ii) a second mode of mirroring a second reference current that is produced by the second current drive module or a third current drive module coupled to the first current drive module.

The first current drive module includes any suitable components such as a first mirror transistor (a.k.a., a switch) and a first bias transistor (a.k.a., a switch) coupled to the first mirror transistor. The first bias transistor may be activated to an ON state in the first mode to connect a bias voltage supplying bias current to the first mirror transistor such that the first mirror transistor contributes to producing the first reference current while in the first mode. The first bias transistor may be deactivated to an OFF state in the second mode. The first current drive module may further include a first output transistor coupled to the first mirror transistor. The first output transistor may be activated to an ON state in the second mode to connect an output node (such as Vmsb) of the digital-to-analog converter to the first mirror transistor such that the first mirror transistor produces the second reference current through the first output transistor in the second mode. The second current drive module may include a second output transistor coupled to a second mirror transistor in the second current drive module. A gate of the second mirror transistor may be coupled to a gate of the first mirror transistor (such as common gate drive signal drives both the gate of the first current drive module and the gate of the se current drive module); the second output transistor of the second current drive module may be activated to an ON state while the first current drive module is in the first mode. The activated second output transistor of the second current drive module may connect the output node of the digital-to-analog converter to the second mirror transistor of the second current drive module such that the second mirror transistor produces a copy of the first reference current through the activated second output transistor.

Each of the first current drive module and the second current drive module may be operative to receive current supplied from a bias voltage supplying current from error sense circuitry. The first current drive module may be configured to generate the first reference current from the current supplied from the bias voltage while the first current drive module is in the first mode.

The first current drive module may be further switchable between the first mode, the second mode, and a third mode; the first current drive module may not generate the first reference current or mirror the second reference current while in the third mode.

The digital-to-analog converter as discussed herein can be configured to further include a sequence of multiple current drive modules coupled to each other. The sequence of multiple current drive modules may include at least the first current drive module, the second current drive module, and the third current drive module. Each of the current drive modules in the sequence is switchable between the first mode and the second mode.

The apparatus herein may further include a controller. The controller may control the first current drive module and other current drive modules in the digital-to-analog converter via at least one thermometer encoded selection signal.

The first current drive module may include a first transistor and a second transistor; the first transistor may be set to an ON state and the second transistor may be set to an OFF state to select the first mode, at least a portion of the first reference current flows through the first transistor of the first current drive module during the first mode. The first transistor (in the first current drive module) is set to an OFF state and the second transistor (in the first current drive module) is set to an ON state to select the second mode. A mirrored rendition of the second reference current may flow through the second transistor of the second current drive module during the second mode.

As further discussed herein, the digital-to-analog converter may receive a bias voltage and supply the bias voltage to each of the first current drive module, the second current drive module, and the third current drive module. A magnitude of the first reference current may depend on a number, X, of current drive modules including the first current drive module that are operated in the first mode. The magnitude of the first reference current may equal: (a magnitude of Idac-ref)/X, where Idac-ref represents current supplied by the bias voltage.

As previously discussed, the sequence of multiple current drive modules as discussed herein may at least the first current drive module, the second current drive module, the third current drive module, etc. Each of the multiple current drive modules in the sequence may include a respective transistor driven and controlled by a common gate drive control signal to support selectable current mirroring amongst the multiple current drive modules.

The apparatus as discussed herein may include a controller operative to delay reconfiguration of switching from the first mode to the second mode with respect to sampling an error signal produced by error sense circuitry coupled to the digital-to-analog converter; the first current drive module and the second current drive module may control current though the error sense circuitry.

As further discussed herein, the digital-to-analog converter may reside in an error sense tracking loop. The digital-to-analog converter may control a magnitude of one or more currents through circuit paths of an error sense circuit of the error sense tracking loop. A corresponding controller may control the magnitude of the current through the error sense circuit via control of the sequence of current drive modules in the digital-to-analog converter, the sequence including at least the first current drive module, the second current drive module, and the third current drive module. The controller may adjust a magnitude of the currents through the error sense circuit over time based on an error signal generated by the error sense circuit. Adjustment of the magnitude of the currents based on control of the sequence of current drive modules may reduce a magnitude of the error signal.

These and other more specific embodiments are disclosed in more detail below.

Note that although embodiments as discussed herein are applicable to power converters, the concepts disclosed herein may be advantageously applied to any other suitable topologies as well as general power supply control applications.

Note that any of the resources as discussed herein can include one or more computerized devices, mobile communication devices, servers, base stations, wireless communication equipment, communication management systems, workstations, user equipment, handheld or laptop computers, or the like to carry out and/or support any or all of the method operations disclosed herein. In other words, one or more computerized devices or processors can be programmed and/or configured to operate as explained herein to carry out the different embodiments as described herein.

Yet other embodiments herein include software programs to perform the steps and operations summarized above and disclosed in detail below. One such embodiment comprises a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, embodiments herein are directed to methods, systems, computer program products, etc., that support operations as discussed herein.

One embodiment herein includes a computer readable storage medium and/or system having instructions stored thereon. The instructions, when executed by computer processor hardware, cause the computer processor hardware (such as one or more co-located or disparately located processor devices) to: control a first current drive module to operate in a first mode of producing a first reference current that is mirrored by a second current drive module coupled to the first current drive module; control the first current drive module to operate in a second mode of mirroring a second reference current that is produced by a third current drive module coupled to the first current drive module; and switch between operating the first current drive module in the first mode and the second mode.

The ordering of the steps above has been added for clarity sake. Note that any of the processing steps as discussed herein can be performed in any suitable order.

Other embodiments of the present disclosure include software programs and/or respective hardware to perform any of the method embodiment steps and operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

As discussed herein, techniques herein are well suited for use in the field of implementing one or more voltage converters to deliver current to a load. However, it should be noted that embodiments herein are not limited to use in such applications and that the techniques discussed herein are well suited for other applications as well.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein (BRIEF DESCRIPTION OF EMBODIMENTS) purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section (which is a further summary of embodiments) and corresponding figures of the present disclosure as further discussed below.

BRIEF DESCRIPTION OF THE DRAWINGS

FIGS. 1A and 1B are example general diagrams illustrating control of current drive modules and generation of current in a digital-to-analog converter as discussed herein.

FIGS. 2A and 2B are example general diagrams illustrating control of current drive modules and generation of current in a digital-to-analog converter as discussed herein.

FIG. 8 is an example diagram illustrating different control states of controlling multiple current drive modules as discussed herein.

FIG. 9 is an example diagram illustrating operation of multiple current drive modules in different modes over time as discussed herein.

Figure 3:
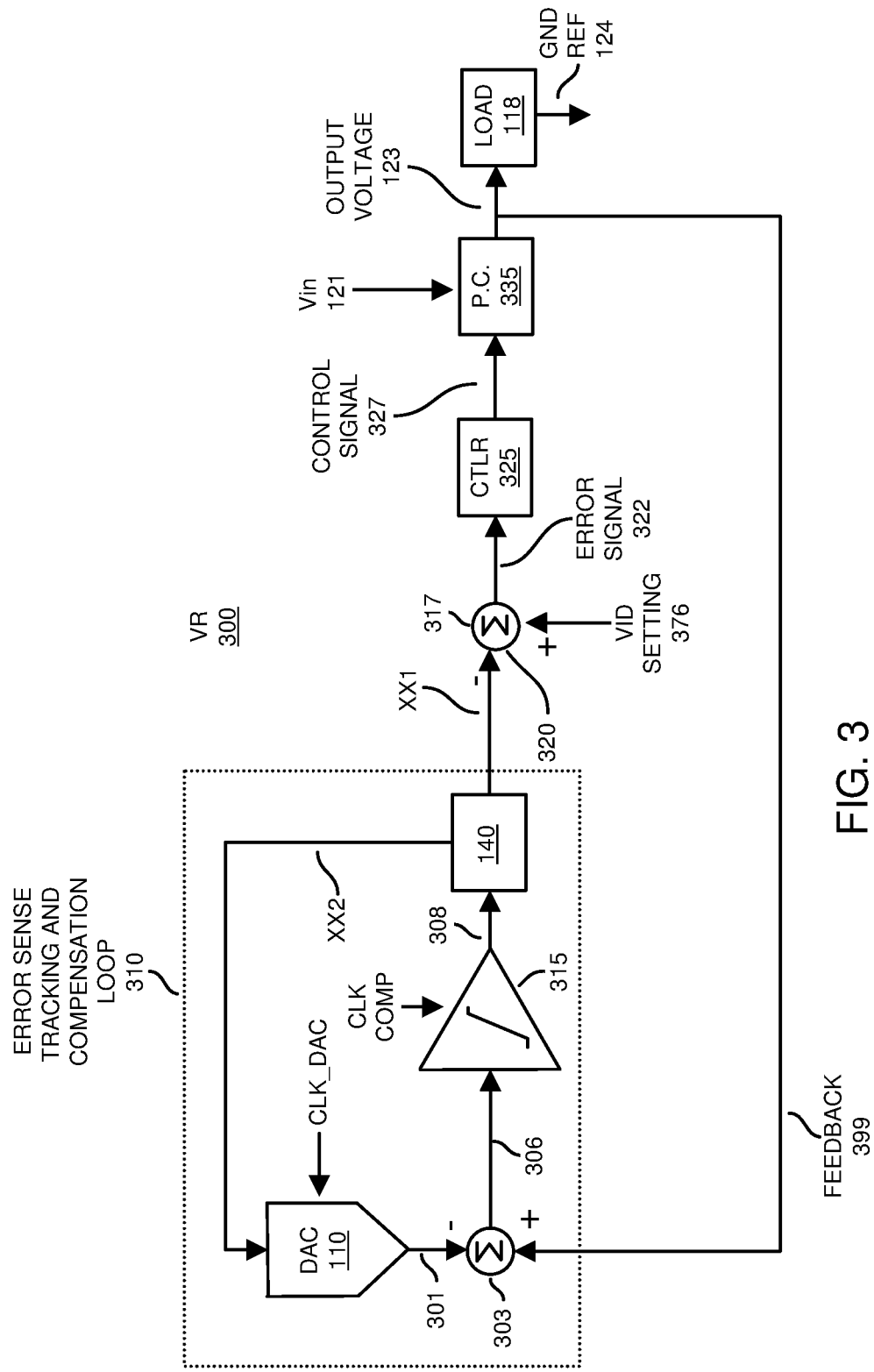
FIG. 3 is an example diagram illustrating a voltage regulator implementing a compensation loop as discussed herein.

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

More specifically, an apparatus may include digital-to-analog converter circuitry comprising a sequence of multiple current drive modules. The sequence may include a first current drive module and a second current drive module of a digital-to-analog converter. The first current drive module is switchable between: i) a first mode of producing a first reference current that is mirrored by a second current drive module coupled to the first current drive module; and ii) a second mode of mirroring a second reference current that is produced by the second current drive module or a third current drive module coupled to the first current drive module.

Now, more specifically, FIG. 1A is an example general diagram illustrating control of current drive modules and generation of current in a digital-to-analog converter as discussed herein As shown in FIG. 1A, controller 140 controls operation of the current drive modules 121-1, 121-2, etc., of analog-to-digital converter 110. As their name suggest, the current drive modules control a flow of current.

For example, for time duration TD1-1, the controller 140 produces control signals 105, which cause the current drive module 121-1 to operate in mode A and produce the bias current 131-1 (reference current CB1). The current drive module 121-2 is coupled to the current drive module 121-1. Further, during time duration TD1-1, the current drive module 121-2 is operated in mode B such as a mirror mode in which the current drive module 121-2 produces a respective output current 131-2 (CB1-copy), which is a copy of the first reference current 131-1. The magnitude of the current 131-1 may equal the magnitude of the current 131-2.

Each of the one or more current drive modules as described herein is switchable between a first mode (such as mode A to produce a bias current) and the second mode (such as mode B or mirror mode to produce a copy of the bias current).

For example, as shown in FIG. 1B, for time duration TD1-2, the controller 140 produces control signals 105, which cause the current drive module 121-2 to operate in mode A and produce the bias current 131-4 (reference current CB2). As previously discussed, the current drive module 121-1 is coupled to the current drive module 121-2. Further, during time duration TD1-2, the current drive module 121-1 is operated in mode B such as a mirror mode in which the current drive module 121-1 produces a respective output current 131-3 (CB2-copy), which is a copy of the reference current 131-4. The magnitude of the current 131-3 may equal the magnitude of the current 131-4.

Thus, the current drive module 121-1 is switchable between: i) a first mode (mode A) of producing a first reference current 131-1 that is mirrored by a second current drive module 121-2 coupled to the first current drive module 121-1; and ii) a second mode (mode B) of mirroring a second reference current 131-4 that is produced by the current drive module 121-2.

Additional configurations of the digital-to-analog converter 110 and corresponding one or more current drive modules is further discussed below.

FIG. 2A is an example general diagram illustrating control of multiple current drive modules and generation of current in a digital-to-analog converter as discussed herein.

As previously discussed, the analog-to-digital converter 110 can include any number of current drive modules coupled to each other. In this example, the analog-to-digital converter 110 includes current drive module 121-1, current drive motor 121-2, current drive module 121-3, current drive module 121-4, etc. Each of the current drive modules are connected to each other and are controlled by control signals 105.

In this example, each of the current drive modules in the sequence is switchable between the first mode of producing a reference bias current, the second mode of mirroring a reference bias current, and a third mode in which the current drive module is operated in an inactive state (or hold mode) in which the corresponding current drive module does not generate the reference current (such as bias current) or a mirror current (from the bias current). Additional modes are possible.

As a more specific example, for time duration TD2-1, the controller 140 controls the current drive module 121-1 in FIG. 2A to produce the reference current 221-1 (such as reference bias current CB1). Current drive module 121-2 is operated in a mirror mode. In such an instance, the current drive module 121-2 produces mirror current 221-2 (CB1-copy). As its name suggests, based on mirroring, the magnitude of the current 221-2 is substantially equal to the current 221-1.

Further, in time duration TD2-1, each of the current drive module 121-3 and the current drive module 121-4 produce or allow flow of a hold current (CH). For example, the controller 140 controls the current drive module 121-3 to produce a hold current 221-3 (CH), which is a current independent of other current drive modules operated in the bias mode or mirror mode. The controller 140 controls the current drive module 121-4 to produce hold current 221-4 (CH), which is a current independent of other current drive modules operated in the bias mode or mirror mode.

Operating one or more of the current drive modules as described herein in the hold mode (when inactive such as not generating a bias current or mirroring a bias current) enables a smooth transition when switching operation of a respective control drive module from producing or allowing flow of hold current to producing bias current or switching a current drive module from generating hold current to mirroring a bias current.

FIG. 2B is an example general diagram illustrating control of current drive modules and generation of current in a digital-to-analog converter as discussed herein.

In this example, for time duration TD2-2, the controller 140 controls the current drive module 121-3 in FIG. 2B to produce the reference current 221-7 (such as reference bias current CB2). Current drive module 121-1 is operated in a mirror mode. In such an instance, the current drive module 121-1 produces mirror current 221-5 (CB2-copy). As its name suggests, based on mirroring, the magnitude of the current 221-5 is substantially equal to the current 221-7.

Further in time duration TD2-2, each of the current drive module 121-2 and the current drive module 121-4 produce or allow flow of a hold current (CH). For example, the controller 140 controls the current drive module 121-2 to produce a hold current 221-6 (CH), which is a current independent of other current drive modules operated in the bias mode or mirror mode. The controller 140 controls the current drive module 121-4 to produce hold current 221-8 (CH), which is a current independent of other current drive modules operated in the bias mode or mirror mode.

As previously discussed, operating one or more of the current drive modules as described herein in the hold mode (when inactive such as not generating a bias current or mirroring a bias current) enables a smooth transition when switching operation of a respective control drive module from producing hold current to producing bias current or switching a current drive module from generating hold current to mirroring a bias current.

As further discussed herein, the controller 140 can be configured to vary modes of operating each of the current drive modules such that: i) selection of one or more current drive modules to operate in the bias mode varies over time, ii) selection of one or more current drive modules to operate in the mirror mode varies over time, iii) selection of one or more current drive modules to operate in the hold mode varies over time, and so on.

FIG. 3 is an example diagram illustrating a voltage regulator implementing a compensation loop as discussed herein.

As shown in FIG. 3, the voltage regulator 300 includes an error sense tracking and compensation loop 310, summer 317, controller 325 (such as a PID controller), power converter 335 (including power converter components such as switches, drivers, inductors, windings, capacitors, etc.), and load 118.

The power converter 335 and corresponding components are operable to convert the input voltage 121 into the output voltage 123 based upon control signals 327 generated by the power converter controller 325. Note that the power converter 335 can be configured in any suitable manner such based on a buck converter topology, boost converter topology, etc.

As further shown, the error sense tracking and compensation loop 310 includes digital-to-analog converter 110, summer 303, comparator 315, and controller 140.

During operation, the summer 303 receives the feedback 339 (such as output voltage 123, ground reference 124) powering the load 118 and produces error signal 306 such as based on a difference between the digital-to-analog converter output signal 301 and the received feedback 399.

The comparator 315 receives the signal 306. The comparator 315 produces a sample of the error signal 308 depending upon a state of the error signal 306 being greater than or less than a threshold value such as 0 or other suitable value. The comparator 315 can be configured to determine whether the error signal 306 is a positive or negative value.

Controller 140 receives and uses the signal 308 as a basis in which to produce and adjust a digital output voltage value (signal XX1) communicated to the summer 317 and the digital output voltage value (signal XX2) to the digital-to-analog converter 110. For example, the controller 140 produces a compensated output voltage value that is encoded in accordance with a first encoding format into signal XX1 and a second encoding format into signal XX2. Signal XX2 communicated to the digital to analog converter 110 controls the output of the digital-to-analog converter 110; signal XX1 communicated to the summer 317 is an accurate and compensated digital representation of the output voltage 123 over time.

As further shown, the clk-dac signal (sample clock signal) controls updating a state of the digital-to-analog converter 110 according to received control signal XX2; the clk-comp signal (sample clock signal associated with the loop comparator 315) controls sampling of the error signal 306 and generation of error signal 308.

The dynamic load 118 or other suitable entity produces a reference voltage or control setting value (such as VID setting 376) in which to control a magnitude of the output voltage 123. In other words, the voltage regulator 300 is configured to regulate a magnitude of the output voltage 123 to be substantially equal to the reference voltage setting 376.

More specifically, the summer 317 receives the reference voltage setting 376 (such as VID setting) and produces a respective error signal 322 (such as error voltage or error voltage value) based on a difference between the reference voltage setting 376 and the compensated output voltage value XX1 (representation of output voltage 123 including any compensation) authentication server applied by the controller 140.

Based on the error signal 322 indicating whether the magnitude of the output voltage 123 is too high or too low with respect to the reference voltage setting 376, the controller 325 adjusts and produces one or more control signals to control power converter 335, which converts the input voltage 121 into the output voltage 123 that powers the dynamic load 118. The adjustment, over time, to the control signals 327 based on the magnitude of the error signal 322 maintains a magnitude of the output voltage at the desired setting 376.

Note that the magnitude of the reference voltage setting 376 may vary over time. In a manner as previously discussed, the magnitude of the output voltage 123 tracks the setting 376.

Figure 4:
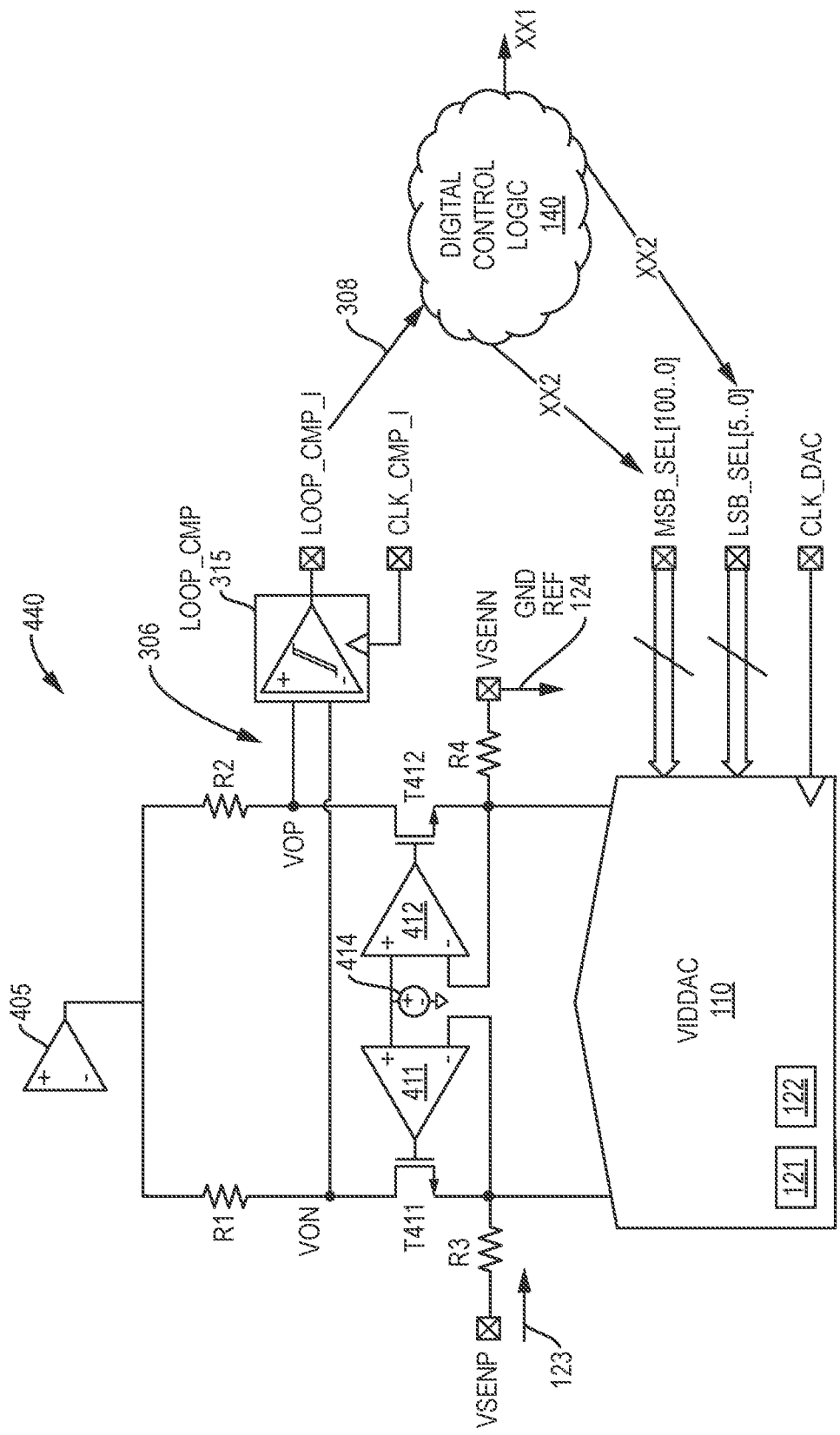
FIG. 4 is a more detailed example diagram illustrating a voltage sensor analog-to-digital converter including a compensation loop as discussed herein.

FIG. 4 is a more detailed example diagram illustrating a voltage sensor analog-to-digital converter implementing an error sense tracking and compensation loop as discussed herein.

In this example embodiment, the error sense tracking and compensation loop 310 includes voltage source 105, resistor R1, resistor R2, amplifier 411, amplifier 412, voltage source 414, transistor T411, transistor T412, resistor R3, resistor R4, digital to analog converter 110, comparator 315, and controller 140. The digital-to-analog converter 110 include multiple current drive modules controlled by control signals XX2.

In general, the digital-to-analog converter 110 controls sinking of current (a.k.a., output current) with respect to the error sense circuitry 440. As shown, the error sense circuitry 440 receives the output voltage 123 at node VSENP and ground reference 124 at node VSENN. The comparator 315 monitors the error signal 306 such as a difference between the voltage at node Von and node Vop and produces respective error signal 308, which represents a sample of the difference voltage.

Ideally, if the digital-to-analog converter 110 is set to the proper setting via signal XX2 (controlling respective current drive modules), then the error signal 306 is zero. In such an instance, the current from voltage source 405 through R1 equals the current from voltage source 405 through R2. However, when there is an imbalance of current through resistor R1 and resistor R2, the comparator 350 produces a respective error signal 308 provided to the controller 140. In response to the detected error 308, the controller 140 adjusts the control signal XX2 up or down such that the error signal 306 goes to zero.

As previously discussed, in addition to generating the control signal XX2, the controller 140 generates the signal XX1, which is a digital representation of the output voltage 123 as indicated by the feedback 399 (of FIG. 3). The signal XX1 and signal XX2 indicate the same value except that they are encoded in different encoding formats. For example, as further discussed herein, all or a portion of the signal XX2 is thermometer encoded to control activation of one or more current drive modules 121 in the digital to analog converter 110. Signal XX1 may be a standard binary coded signal indicating a magnitude of the output voltage 123 (i.e., difference between output voltage 123 and the reference voltage 124).

Thus, the digital-to-analog converter 110 including multiple current drive modules 121 resides in error sense tracking and compensation loop 310. As further discussed herein, the digital-to-analog converter 110 controls a magnitude of current through the error sense circuitry 440 via control of the current drive modules. More specifically, the controller 140 controls the magnitude of the current through the error sense circuitry 440 via operation of a sequence of current drive modules 121 including the current drive module 121-1, the current drive module 121-2, current drive module 121-3, etc. The digital-to-analog converter 110 may also include current drive modules 122.

The error sense tracking and compensation loop 310 as discussed herein improves the accuracy along with lifetime and temperature drift of error sense circuitry 440 and corresponding digital-to-analog converter 110 (a.k.a., a voltage sense analog-to-digital converter), which is used to measure the setpoint voltage of a switching DC-DC converter. As previously discussed, FIG. 3 illustrates a generic Switching DC-DC converter with a digital control loop. Referring again to FIG. 4, the customer or other suitable entity programs the voltage identification 'VID' voltage (a.k.a., VID setting 376), which is the desired magnitude of the output voltage 123. The voltage sensor ADC (error sense tracking and compensation loop 310) digitizes the received output voltage sample as signal XX1. Via the summer 317, the digital control loop subtracts the output XX1 of the VSADC from the setting 376 and generates an error signal 322 (such as an error voltage). The error signal 322 is then fed to the controller 325 such as a digital PID' control loop to generate pulses (control signal 327) to control the switching of the power converter 335 to generate the output voltage 123 to power the load 118.

The Voltage Sensor (such as including the error sense circuitry 440) for the controller of a DCDC converter consists of a tracking ADC which digitizes the error between the input voltage 121 and DAC using a single or multiple loop comparators (such as comparator 315). FIG. 4 further illustrates the core of the initial tracking ADC, which digitizes the error voltage using the input current, which itself is equal to the difference between VSENP and VSENN divided by the input resistance (resistor R3 and R4).

Figure 5:
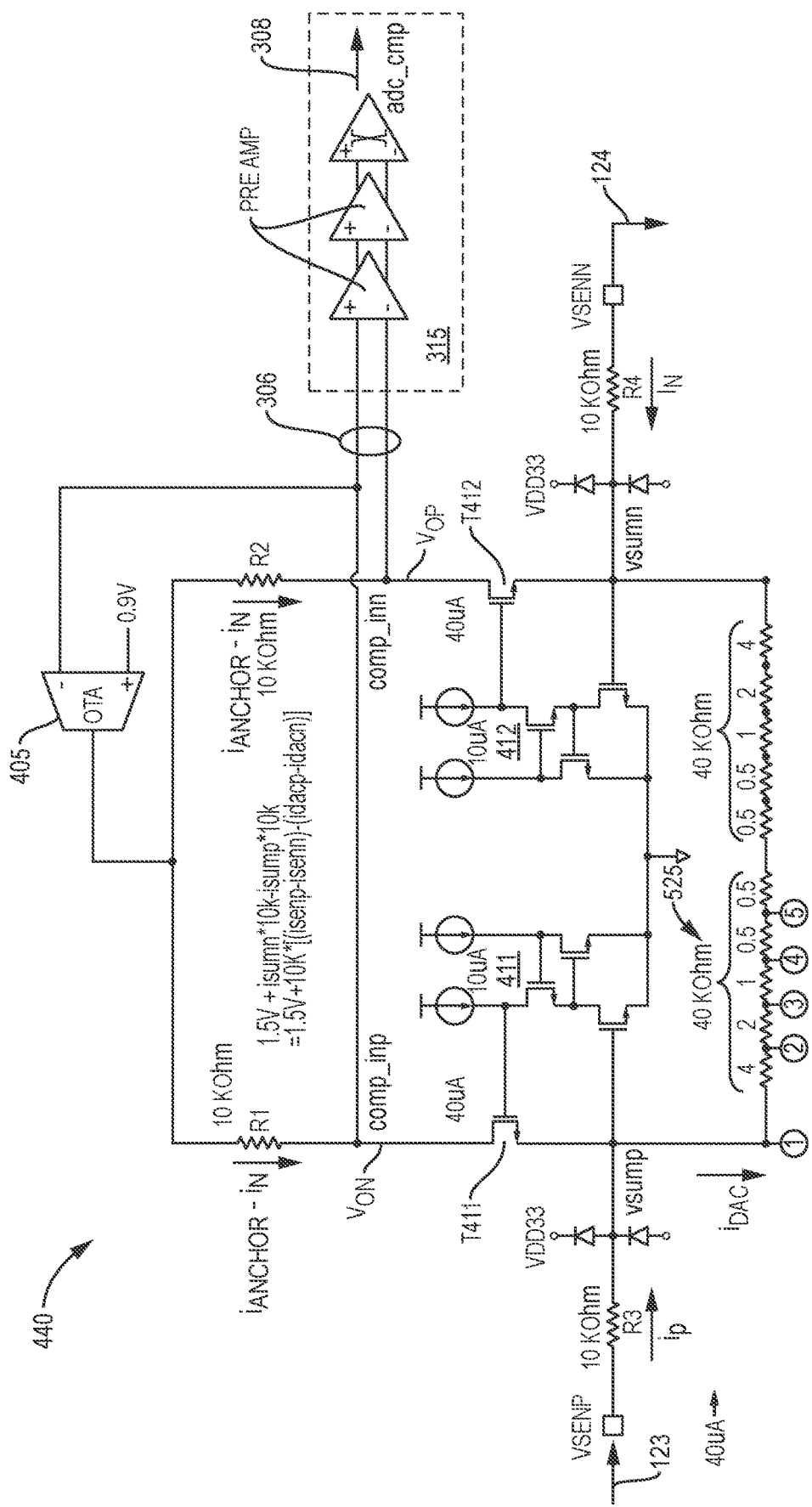
FIG. 5 is an example diagram illustrating a sensor circuit associated with a compensation loop as discussed herein.
Figure 6:
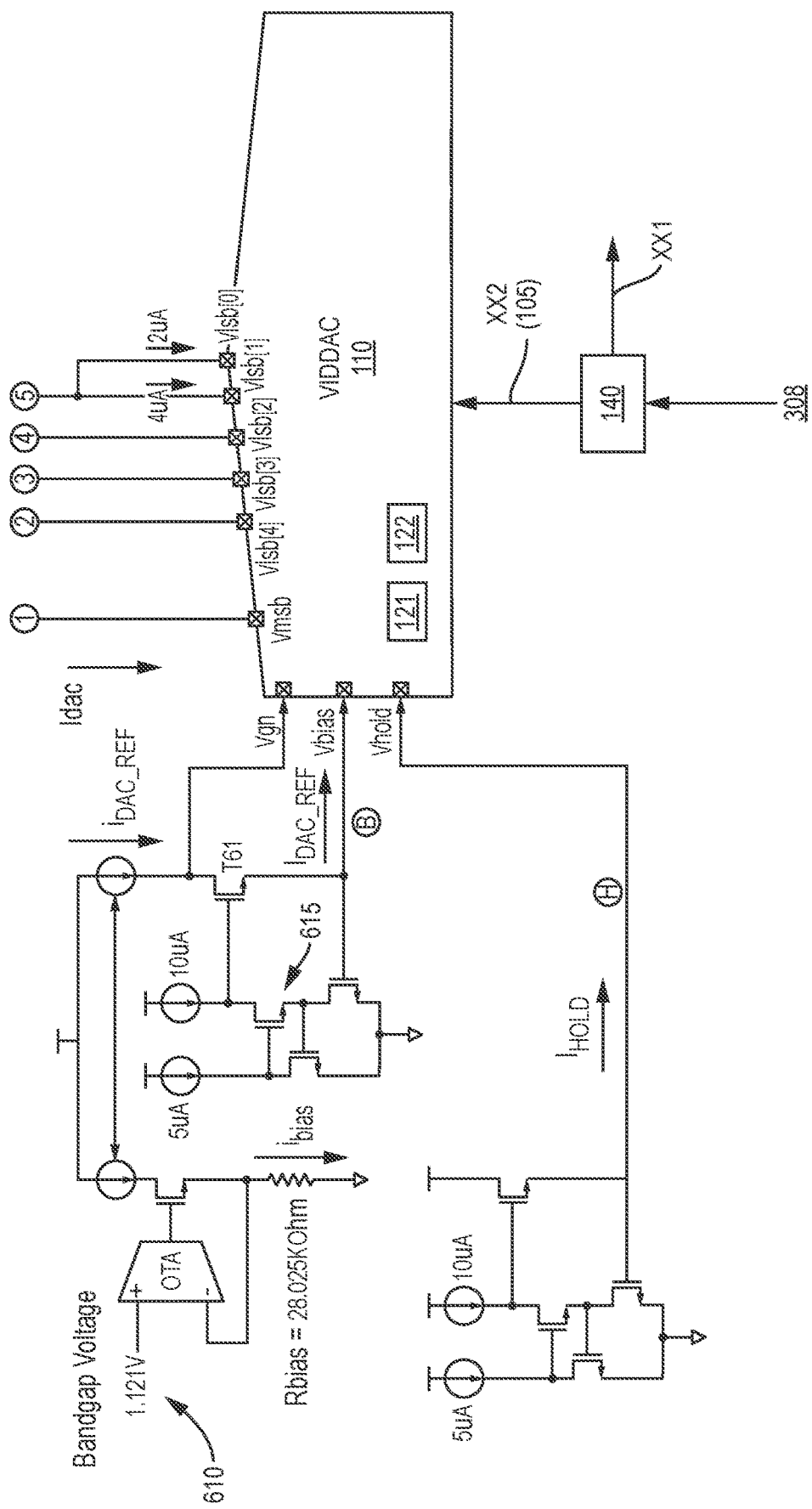
FIG. 6 is an example diagram illustrating a VIDDAC and corresponding circuitry associated with a compensation loop as discussed herein.

FIG. 5 is an example diagram illustrating a sensor circuit associated with a compensation loop as discussed herein. FIG. 6 is an example diagram illustrating a VIDDAC and corresponding circuitry associated with a compensation loop as discussed herein.

The following discussion references both FIGS. 5 and 6.

In this example, the current Ip supplied by the output voltage 123 passes through the resistor R3 (such as a 10 kilo-ohm resistor) to node Vsump (same as node Vmsb, which is the output node of the digital-to-analog converter 110). The current supplied by the ground reference voltage 124 passes through the resistor R4 (such as a 10 kilo-ohm resistor) to node Vnump. As previously discussed, the digital-to-analog converter 110 sinks current (such as output current Idac).

The error signal 306 represents a difference in the voltage Von and voltage Vop. Voltage Von is equal to the voltage Va (from source 405) minus the current through the resistor R1; voltage Vop is equal to the voltage Va minus the current through the resistor R2. Resistors 525 provide weighted sinking of current associated with current drive modules 122 driven by corresponding LSB select signals of signal XX2.

The voltage at node Vsump controls the operation of amplifier 411 and corresponding switch T411. The voltage at node Vsumn controls the operation of amplifier 412 and corresponding switch T412. As previously discussed, via selection of the current drive modules and modes, the controller 140 controls a flow of current Idac such that the magnitude of the error signal 306 is adjusted towards a value of zero.

Reasons for Drift in the Digital-to-Analog Converter 110

Thus, a more detailed figure of the error sense tracking and compensation loop 315 (a.k.a., analog tracking loop) is shown in FIGS. S and 6. In FIG. 6, the current IDAC=ISIG=Ip−In.

The current Ibias is generated from the bandgap voltage 610 (such as 1.121 VDC or other suitable value) divided by the resistor Rbias (such as 28.025 Kohms). The current Ibias is mirrored using PMOS devices 615 to generate the main reference current Idac-ref supplied to the digital-to-analog converter through transistor T61.

The drift error can be separated into gain error drift or offset error drift. The main cause of gain error drift is due to a mismatch drift in the mirroring of Ibias to Idac_ref.

$$I\_SIG=(V\_SENP-V\_SENN)/R\_IN=I\_(DAC\_REF)*N=V\_BG/R\_BIAS*\epsilon MIRROR*4*N$$

N=ADC code, which is #of VID-DAC (current drive modules) cells activated εMIRROR=error of current mirror mismatch $$>N = \frac{R_{BIAS} * (V_{SENP} - V_{SENN})}{R_{IN} * V_{BG} * \varepsilon_{MIRROR} * 4}$$

RBIAS & RIN are very well matched and track over temperature Main error source is from the PMIRROR mismatch Reasons for Drift in the digital-to-analog converter 110

Figure 7:
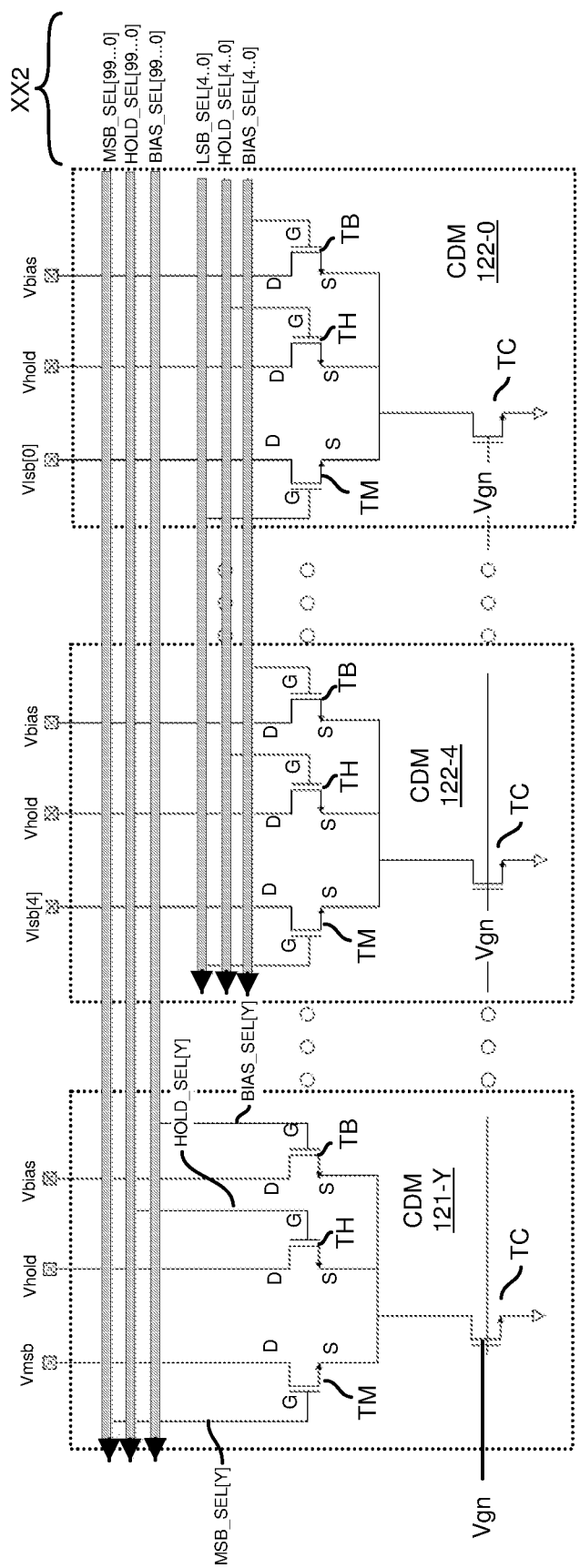
FIG. 7 is an example diagram illustrating multiple current drive modules as discussed herein.

Device Mismatch Drift for a current steering DAC is dominated by the beta mismatch which is proportional toiI. (mobility), Cox(oxide cap) and Width and Length of the device; each device is independent from one another. FIG. 7 shows N bias devices and M output devices where M is the current DAC code. The error current mismatch can be scaled using a constant K. All the bias device mismatch currents are transferred to the output scaled by M/N ratio.

When the cells in the VIDDAC which are assigned as bias cells start to drift, it leads to an output error where the error currents are opposite in magnitude and scaled by the output voltage.

Figure 14:
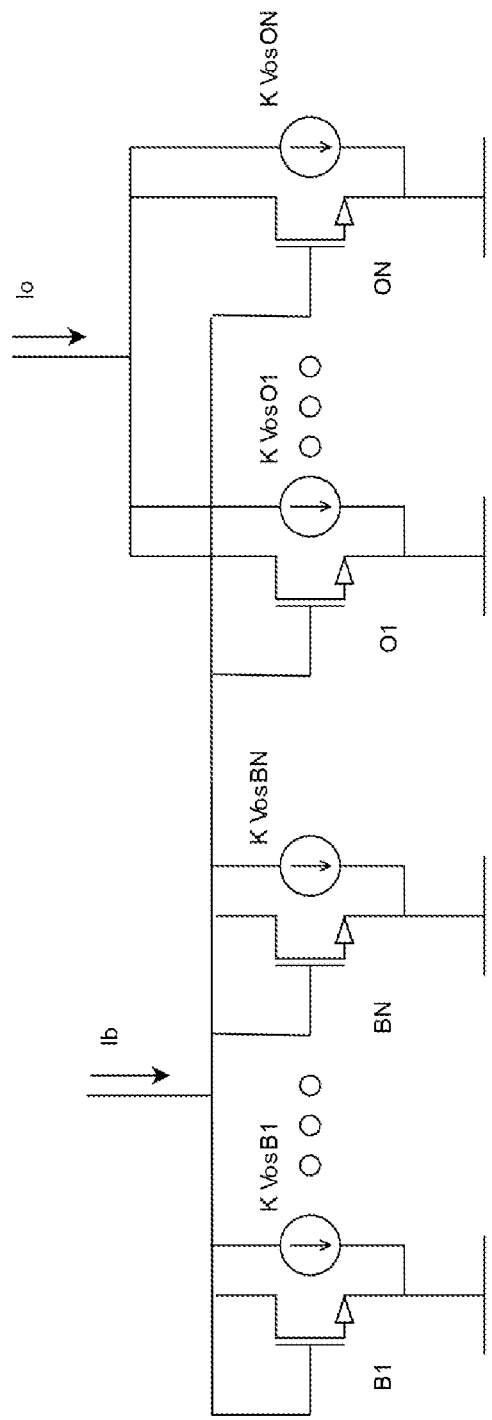
FIG. 14 is an example circuit diagram associated with VIDDAC drift as discussed herein.

The error in the output current (see FIG. 14) is given by the following equation:

$$I_O \simeq \frac{mI_B}{n} + \sqrt{2\beta I_B}\left[\frac{m}{n}\sum_{x=1}^{n} V_{osBx} - \sum_{y=1}^{m} V_{osOy}\right]$$

In order to cancel the error on the output current, the term inside the bracket needs to equal 0

The main cancellation comes from the following: If a certain output voltage requires m devices serving as bias devices, n devices serving as output devices and q devices serving as hold devices, then through DEM (shuffling), each device would spend a n/(n+m+q) fraction of time as a bias device, m/(n+m+q) fraction of time as an output device, and q/(n+m+q) fraction of time as a hold device.

Reasons for drift associated with current drive modules include:

Package stress

Mismatch between current drive modules over the temperature range—threshold voltage mismatch and current factor mismatch The mismatch could change due to stress over temperature The VIDDAC is a current steering DAC which adds current mirror legs to the 'vsump' node or T leg' as the setpoint voltage rises. The current steering DAC is made out of NMOS devices mirrored from a main master device biased from the 'Idac_ref' current Accuracy is also set by the linearity of the analog-to-digital converter 110 (a.k.a., VIDDAC). The controller 140 has two points for conducting the gain trim and one point for conducting the offset trim. Due to inherent non-linearity of the VIDDAC, the setpoint accuracy is highest at the trim point where both gain and offset are conducted. It is the second best at the second gain trim point. In the region in between the trim points, accuracy degrades the furthest away the setpoint is from the trim points.

As further discussed herein, the controller 140 monitors a magnitude of the error signal 306 as generated by the error sense circuitry 440. The controller 140 operates the digital-to-analog converter 110 and adjusts settings (such as bias mode B, hold mode H, active mode M, inactive mode, etc.) of the current drive modules over time based on the received error signal 306. The adjustment to the settings of current drive modules results in adjustment of a magnitude of the current Idac through the error sense circuitry 440. The adjustments of the magnitude of the current Idac (up or down) reduces a magnitude of the error signal 306 towards zero, resulting in the signals XX1 and XX2 being a more accurate digital representations of the output voltage 123 with respect to the reference voltage 124.

FIG. 7 is an example diagram illustrating multiple current drive modules as discussed herein.

In the novel VIDDAC (a.k.a., digital-to-analog converter 110), as shown in FIG. 7, each cell (current drive module) of the VIDDAC could be connected to either 'vsump' node (i.e., Vmsb node of the digital-to-analog converter 110), the 'vbias' node (i.e., Vbias node of the digital-to-analog converter 110), or the 'vhold' node (i.e., Vhold node of the digital-to-analog converter 110). All cells (i.e., current drive modules) can be set to a respective state such as 'active' (connected to vsump), 'hold' (connected to hold leg for standby) or 'bias' (connected as the main current mirror master devices).

Note that DEM could be used on the VIDDAC to cancel the error term. If a certain output voltage setting requires m devices (current drive modules) serving as bias devices (bias mode B), n devices serving as output devices (active mode A), and q devices (i.e., current drive modules) serving as hold devices (hold m ode H), then through DEM, each current drive module would spend a n/(n+m+q) fraction of time in the bias mode B, m/(n+m+q) fraction of time in the active mode A as an output device, and q/(n+m+q) fraction of time in the hold mode H as a hold device.

The ADC and system (such as including the error sense tracking and compensation loop 315) as discussed herein may run off a main clock such as 200 mhz or other suitable value and every clock cycle or a subdivision of the clock cycle, the roles of selected cells are swapped so that the cells are selectively switched between an active mode A, bias mode B, and hold mode H.

The DAC leg steering control bits (such as signal XX2 and corresponding settings MSB_SEL, HOLD_SEL, and BIAS_SEL) can be controlled by latches (see FIG. 12) in order to control the skew. Skew in the bias leg and P leg control lines cause an error when the DAC is switching at a high speed which causes uncontrolled offsets on the same order as an LSB13.

Thus, as shown in FIG. 7, the digital-to-analog converter 110 includes a sequence of current drive modules. More specifically, as previously discussed, the digital-to-analog converter 110 can be configured to include a candidate pool of X current drive modules 121-Y, where Y represents an integer value of the 1-X current drive modules. Each of the current drive modules 121 in the sequence includes a respective transistor TC driven and controlled by a common gate drive control signal Vgn to support selectable current mirroring amongst the multiple current drive modules depending on settings of control signals XX2. The controller 140 can be configured to generate the common gate drive control signal to each of the transistor TC in the current drive modules. The states of respective transistors TM, TH, and TB control whether the respective switch is set to an active mode M, hold mode H, bias mode B, or full inactive mode (corresponding to a condition of none of the switches ON). The transistor TB is a bias mode transistor, the transistor TH is a hold mode transistor, the transistor TM is an active mode transistor.

If desired, the digital-to-analog converter 110 can be configured to include a candidate pool of any number of selectable current drive modules 122 similar to current drive modules 122-4 and 122-1. The digital-to-analog converter 110 can be configured to include one or more current drive modules connected to each respective LSB node (such as each of the nodes Vlsb4, Vlsb3, Vlsb2, etc.) associated with the digital-to-analog converter 110. Selection of the modes associated with each of the current drive modules varies in a similar manner as discussed herein with respect to mode selection of current drive modules 121.

Figure 8:
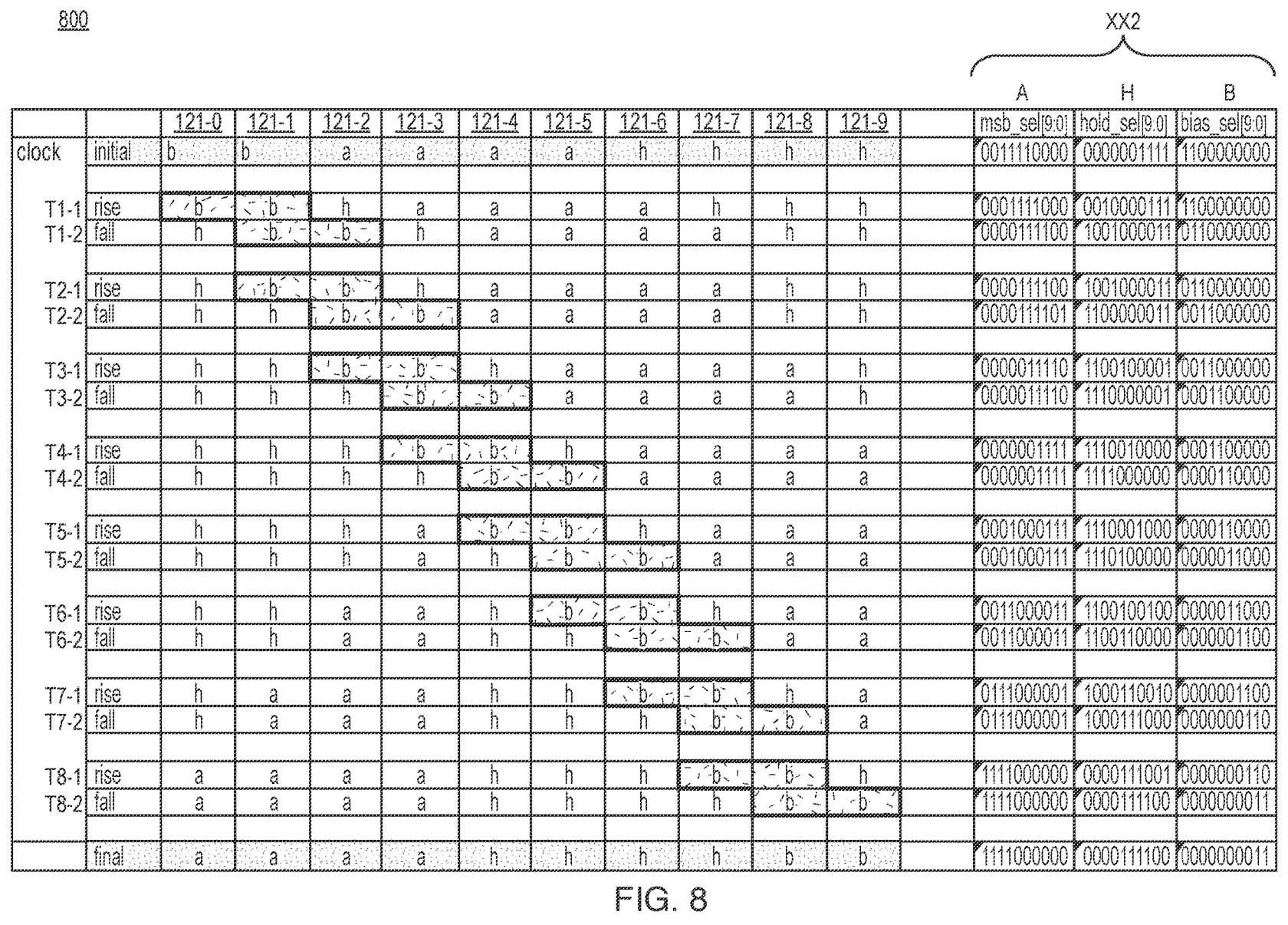

FIG. 8 is an example diagram illustrating different control states of controlling multiple current drive modules as discussed herein.

A unique feature of the dynamic element matching algorithm implemented by the controller 140 in this disclosure is that selection (such as number and/or which) of the current drive modules (a.k.a., cells) operated in the bias mode at any time is constantly changing throughout the sequence of current drive modules, which mitigates the gain drift of the tracking analog-to-digital converter associated with the error sense tracking and compensation loop 315. For example, as shown in graph 800, the controller 140 selects different groupings of the current drive modules 121 to operate in the bias mode at different times. Additionally, the controller 140 selects different groupings of the current drive modules 121 to operate in the hold mode at different times. The controller 140 selects different groupings of the current drive modules 121 to operate in the active mode at different times. As mentioned, this shuffling or re-selection of the current drive modules to operate in the different modes mitigates the gain drift of the tracking analog-to-digital converter associated with the error sense tracking and compensation loop 315 over time.

Note that, if desired, the controller 140 can be configured to operate one or more of the current drive modules 121 in an inactive mode in which none of the respective transistors TM, TH, and TB are set to an ON-state.

In this example, the graph 800 indicates different settings of controlling current drive modules 0-X in the digital to analog converter 110, where X=9. In such an instance, the digital to analog converter 110 includes ten current drive modules (0-9) such as current drive module 121-0, current drive module 121-1, current drive module 121-2, current drive module 121-3, current drive module 121-4, current drive module 121-5, current drive module 121-6, current drive module 121-7, current drive module 121-8, and current drive module 121-9. Each of these current drive modules is configured in a manner as indicated by current drive module 121-X in FIG. 7.

As previously discussed, the controller 140 produces the control signal XX2 such as settings for each current drive module in the digital-to-analog converter 110. Control signal msb_sel0 drives the gate of switch TM (a.k.a., output transistor) of the current drive module 121-0; control signal hold_sel0 drives the gate of switch TH of the current drive module 121-0; control signal bias_sel0 drives the gate of switch TB of the current drive module 121-0.

Control signal msb_sel1 drives the gate of switch TM (a.k.a., output transistor) of the current drive module 121-1; control signal hold_sel1 drives the gate of switch TH of the current drive module 121-1; control signal bias_sel1 drives the gate of switch TB of the current drive module 121-1.

Msb_sel2 drives the gate of switch TM (a.k.a., output transistor) of the current drive module 121-2; hold_sel2 drives the gate of switch TH of the current drive module 121-2; bias_sel2 drives the gate of switch TB of the current drive module 121-2.

Msb_sel3 drives the gate of switch TM (a.k.a., output transistor) of the current drive module 121-3; hold_sel3 drives the gate of switch TH of the current drive module 121-3; bias_sel3 drives the gate of switch TB of the current drive module 121-3.

Msb_sel4 drives the gate of switch TM (a.k.a., output transistor) of the current drive module 121-4; hold_sel4 drives the gate of switch TH of the current drive module 121-4; bias_sel4 drives the gate of switch TB of the current drive module 121-4.

Msb_sel5 drives the gate of switch TM of the current drive module 121-5; hold_sel5 drives the gate of switch TH of the current drive module 121-5; bias_sel5 drives the gate of switch TB of the current drive module 121-5.

Msb_sel6 drives the gate of switch TM of the current drive module 121-6; hold_sel6 drives the gate of switch TH of the current drive module 121-6; bias_sel6 drives the gate of switch TB of the current drive module 121-6.

Msb_sel7 drives the gate of switch TM of the current drive module 121-7; hold_sel7 drives the gate of switch TH of the current drive module 121-7; bias_sel7 drives the gate of switch TB of the current drive module 121-7.

Msb_sel8 drives the gate of switch TM of the current drive module 121-8; hold_sel8 drives the gate of switch TH of the current drive module 121-8; bias_sel8 drives the gate of switch TB of the current drive module 121-8.

Msb_sel9 drives the gate of switch TM of the current drive module 121-9; hold_sel9 drives the gate of switch TH of the current drive module 121-9; bias_sel9 drives the gate of switch TB of the current drive module 121-9.

Figure 10:
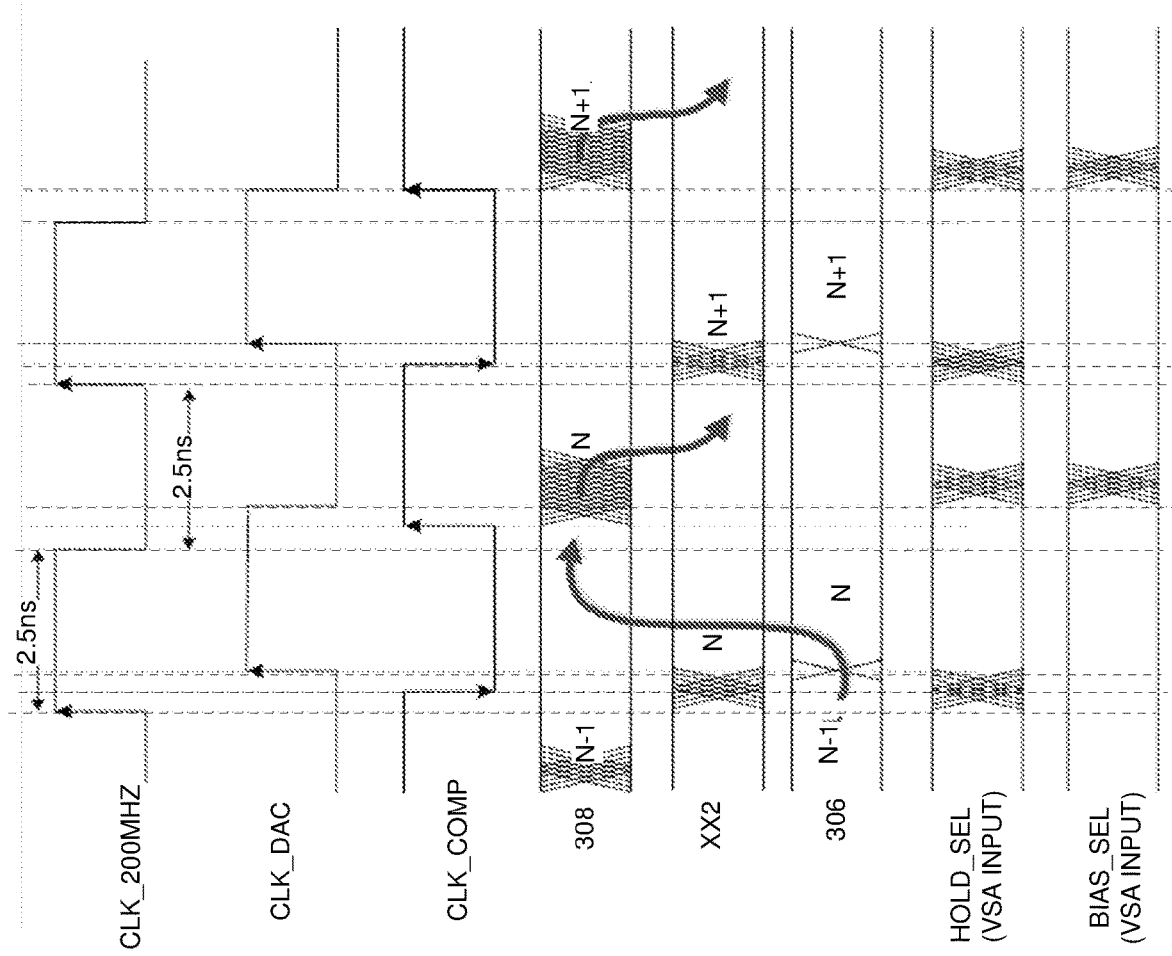
FIG. 10 is an example timing diagram supporting compensation as discussed herein.

FIGS. 9 and 10 illustrate different modes of operating the current drive modules in the digital-to-analog converter 110. In general, the mirrored cells of the digital-to-analog converter 110 have a dynamic element matching feature in which cells (current drive modules) assigned to operate in the different modes (bias, active, or hold) are shuffled with cells assigned as output cells—this feature improves overall linearity and also improves gain and offset drift over temperature and lifetime. In other words, each of the current drive modules can be switched between operating in a bias mode to control bias current, a mirror mode of mirroring bias current, or a hold mode of allowing flow of hold current.

FIG. 9 is an example diagram illustrating operation of multiple current drive modules in different modes over time as discussed herein As previously discussed, each of the current drive modules 121 receives the bias voltage Vbias, the hold voltage Vhold, and is connected to the path 525 (node Vmsb, which is the output node of the digital-to-analog converter 110) supporting flow of current Idac to the digital-to-analog converter 110. Thus, the digital-to-analog converter 110 receives the voltage Vbias and supplies it to each of the current drive modules 121.

As shown in graph 800 in FIG. 8, the controller 140 varies selection of which of the current drive modules 121 are operated in the different modes including the bias mode (mode A), the active mode (mode B), and the inactive mode (mode C). Even though the magnitude of the signal XX1 may not increase or decrease for a given time. Such as between T1-1 and T8-2, the controller 140 implements varying selection of which of the current drive modules 121 (or 122) of the digital-to-analog converter 110 are operated in a particular state such that errors associated with drift are reduced over time.

The magnitude of the bias reference current through the one or more current drive modules set to the bias mode depends on a number, Z, of how many current drive modules are operated in the bias mode. As a more specific example, assume that the magnitude of the current Idac-ref current is 40 microamp. Because current drive module 121-0 and current drive module 121-1 are initially activated before T1-1, the 40 microamp current supplied by the Idac-reference splits such that 20 microamps of current flows through each of the current drive modules 121-0 and 121-1. This means Z=2 and that the bias reference current equals: [(a magnitude of Idac-ref)/Z]=40 microamps/2=20 microamps.

As previously discussed, each of the current drive modules set to the active mode (mode A) produces a respective copy of the bias reference current produced by the current drive modules in the bias mode. In this example, initially at T1-1, current drive modules 121-3, 121-4, 121-5, and 121-6, are set to the active mode sinking current Idac from the error sense circuitry 440. Based on mirroring, each of the current drive modules 121-3, 121-4, 121-5, and 121-6 sinks 20 microamps such that the total amount of current sunk by Idac is 4×20=80 microamps at the initial time before time T1-1.

Time T1-2 (Control Signal XX2 Set as Shown in Graph 800)

On the falling edge of the clk-dac at time T1-2, the controller 140 switches current drive module 121-0 from a bias mode to a hold mode in which the transistor TH is ON via driving the gate of transistor TH with hold_sel0=logic 1. The controller 140 produces msb_sel0=logic 0, which drives the gate of transistor TM and controls the transistor TM to an OFF-state. The controller 140 produces bias_sel0=logic 0, which drives the gate of transistor TB and controls the transistor TB to an OFF-state. In such an instance, hold current from node Vhold flows through the transistor TH of the current drive module 121-1.

On the falling edge of the clk-dac at time T1-2, the controller 140 does not change the mode of the current drive module 121-1. For example, the controller 140 continues to set msb_sel1 to a logic zero, setting the transistor TM to an OFF-state. The controller 140 continues to set hold_sel1 to a logic zero (setting the transistor TH) to an OFF-state. The controller 140 continues to set bias_sel1 to a logic high (setting the transistor TB) to an ON-state.

On the falling edge of the clk-dac at time T1-2, the controller 140 switches current drive module 121-2 from a hold mode to a bias mode in which the transistor TH is OFF via driving the gate of transistor TH with hold_sel2=logic 0. The controller 140 produces msb_sel2=logic 0, which drives the gate of transistor TM and controls the transistor TM to an OFF-state. The controller 140 produces bias_sel2=logic 1, which drives the gate of transistor TB and controls the transistor TB to an ON-state. In such an instance, Idac current from node Vbias node flows through the transistor TB of the current drive module 121-1.

On the falling edge of the clk-dac at time T1-2, the controller 140 switches current drive module 121-3 from an active mode to a hold mode in which the transistor TH is ON via driving the gate of transistor TH with hold_sel3=logic 1. The controller 140 produces msb_sel3=logic 0, which drives the gate of transistor TM and controls the transistor TM to an OFF-state. The controller 140 produces bias_sel3=logic 0, which drives the gate of transistor TB and controls the transistor TB to an OFF-state. In such an instance, hold current from node Vhold flows through the transistor TH of the current drive module 121-3.

On the falling edge of the clk-dac at time T1-2, the controller 140 does not change the mode of the current drive module 121-4. For example, the controller 140 continues to set msb_sel4 to a logic high (setting the transistor TM to an ON-state). The controller 140 continues to set hold_sel4 to a logic zero (setting the transistor TH) to an OFF-state. The controller 140 continues to set bias_sel4 to a logic low (setting the transistor TB) to an OFF-state.

On the falling edge of the clk-dac at time T1-2, the controller 140 does not change the mode of the current drive module 121-5. For example, the controller 140 continues to set msb_sel5 to a logic high (setting the transistor TM to an ON-state). The controller 140 continues to set hold_sel5 to a logic zero (setting the transistor TH) to an OFF-state. The controller 140 continues to set bias_sel5 to a logic low (setting the transistor TB) to an OFF-state.

On the falling edge of the clk-dac at time T1-2, the controller 140 does not change the mode of the current drive module 121-6. For example, the controller 140 continues to set msb_sel6 to a logic high (setting the transistor TM to an ON-state). The controller 140 continues to set hold_sel6 to a logic zero (setting the transistor TH) to an OFF-state. The controller 140 continues to set bias_sel6 to a logic low (setting the transistor TB) to an OFF-state.

On the falling edge of the clk-dac at time T1-2, the controller 140 switches current drive module 121-7 from a hold mode to an active mode in which the transistor TH is OFF via driving the gate of transistor TH with hold_sel7=logic 0. The controller 140 produces msb_sel7=logic 1, which drives the gate of transistor TM and controls the transistor TM to an ON-state. The controller 140 produces bias_sel7=logic 0, which drives the gate of transistor TB and controls the transistor TB to an OFF-state. In such an instance, Idac-ref current from node Vmsb flows through the transistor TM of the current drive module 121-7.

On the falling edge of the clk-dac at time T1-2, the controller 140 does not change the mode of the current drive module 121-8. For example, the controller 140 continues to set msb_sel8 to a logic low setting the transistor TM to an OFF-state. The controller 140 continues to set hold_sel8 to a logic high (setting the transistor TH) to an ON-state. The controller 140 continues to set bias_sel8 to a logic low (setting the transistor TB) to an OFF-state.

On the falling edge of the clk-dac at time T1-2, the controller 140 does not change the mode of the current drive module 121-9. For example, the controller 140 continues to set msb_sel9 to a logic low setting the transistor TM to an OFF-state. The controller 140 continues to set hold_sel9 to a logic high (setting the transistor TH) to an ON-state. The controller 140 continues to set bias_sel9 to a logic low (setting the transistor TB) to an OFF-state.

Thus, at time T1-2, Idac-ref of 40 uA is split between current drive modules 121-1 and 121-2 to produce a reference current of 20 uA. The active current drive modules 121-4, 121-5, 121-6, and 121-7 each mirror the reference current of 20 uA to produce a cur Idac of 80 uA.

There is no change in the signal XX2 on the rising edge of clk-dac at time T2-1.

Time T2-2 (Control Signal XX2 Set as Shown in Graph 800)

On the falling edge of the clk-dac at time T2-2, the controller 140 does not change the mode of the current drive module 121-0. For example, the controller 140 continues to set msb_sel0 to a logic low setting the transistor TM to an OFF-state. The controller 140 continues to set hold_sel0 to a logic high (setting the transistor TH) to an ON-state. The controller 140 continues to set bias_sel0 to a logic low (setting the transistor TB) to an OFF-state.

On the falling edge of the clk-dac at time T2-2, the controller 140 switches current drive module 121-1 from a bias mode to a hold mode in which the transistor TH is ON via driving the gate of transistor TH with hold_sel1=logic 1. The controller 140 produces msb_sel1=logic 0, which drives the gate of transistor TM and controls the transistor TM to an OFF-state. The controller 140 produces bias_sel1=logic 0, which drives the gate of transistor TB and controls the transistor TB to an OFF-state. In such an instance, hold current from node Vhold flows through the transistor TH of the current drive module 121-1.

On the falling edge of the clk-dac at time T2-2, the controller 140 does not change the mode of the current drive module 121-2. For example, the controller 140 continues to set msb_sel2 to a logic zero (setting the transistor TM to an OFF-state. The controller 140 continues to set hold_sel2 to a logic zero (setting the transistor TH) to an OFF-state. The controller 140 continues to set bias_sel2 to a logic high (setting the transistor TB) to an ON-state.

On the falling edge of the clk-dac at time T2-2, the controller 140 switches current drive module 121-3 from a hold mode to a bias mode in which the transistor TH is OFF via driving the gate of transistor TH with hold_sel3=logic 0. The controller 140 produces msb_sel3=logic 0, which drives the gate of transistor TM and controls the transistor TM to an OFF-state. The controller 140 produces bias_sel3=logic 1, which drives the gate of transistor TB and controls the transistor TB to an ON-state. In such an instance, Idac current from node Vbias node flows through the transistor TB of the current drive module 121-3.

On the falling edge of the clk-digital-to-analog converter at time T2-2, the controller 140 does not change the mode of the current drive module 121-4. For example, the controller 140 continues to set msb_sel4 to a logic high (setting the transistor TM to an ON-state. The controller 140 continues to set hold_sel4 to a logic zero (setting the transistor TH) to an OFF-state. The controller 140 continues to set bias_sel4 to a logic low (setting the transistor TB) to an OFF-state.

On the falling edge of the clk-dac at time T2-2, the controller 140 does not change the mode of the current drive module 121-5. For example, the controller 140 continues to set msb_sel5 to a logic high (setting the transistor TM to an ON-state. The controller 140 continues to set hold_sel5 to a logic zero (setting the transistor TH) to an OFF-state. The controller 140 continues to set bias_sel5 to a logic low (setting the transistor TB) to an OFF-state.

On the falling edge of the clk-dac at time T2-2, the controller 140 does not change the mode of the current drive module 121-6. For example, the controller 140 continues to set msb_sel6 to a logic high (setting the transistor TM to an ON-state. The controller 140 continues to set hold_sel6 to a logic zero (setting the transistor TH) to an OFF-state. The controller 140 continues to set bias_sel6 to a logic low (setting the transistor TB) to an OFF-state.

On the falling edge of the clk-dac at time T2-2, the controller 140 does not change the mode of the current drive module 121-7. For example, the controller 140 continues to set msb_sel7 to a logic high (setting the transistor TM to an ON-state. The controller 140 continues to set hold_sel7 to a logic zero (setting the transistor TH) to an OFF-state. The controller 140 continues to set bias_sel7 to a logic low (setting the transistor TB) to an OFF-state.

On the falling edge of the clk-digital-to-analog converter at time T2-2, the controller 140 does not change the mode of the current drive module 121-8. For example, the controller 140 continues to set msb_sel8 to a logic low setting the transistor TM to an OFF-state. The controller 140 continues to set hold_sel8 to a logic high (setting the transistor TH) to an ON-state. The controller 140 continues to set bias_sel8 to a logic low (setting the transistor TB) to an OFF-state.

On the falling edge of the clk-dac at time T2-2, the controller 140 does not change the mode of the current drive module 121-9. For example, the controller 140 continues to set msb_sel9 to a logic low setting the transistor TM to an OFF-state. The controller 140 continues to set hold_sel9 to a logic high (setting the transistor TH) to an ON-state. The controller 140 continues to set bias_sel9 to a logic low (setting the transistor TB) to an OFF-state.

Thus, at time T2-2, Idac-ref of 40 uA is split between current drive modules 121-2 and 121-3 to produce a reference current of 20 uA. The active current drive modules 121-4, 121-5, 121-6, and 121-7 each mirror the reference current of 20 uA to produce a cur Idac of 80 uA.

In a similar manner, the controller 140 changes states of the current drive modules as shown in graph 800 of FIG. 8 at each falling edge of the clk-dac.

For example, at time T3-2, Idac-ref of 40 uA is split between current drive modules 121-3 and 121-4 to produce a reference current of 20 uA. The active current drive modules 121-5, 121-6, 121-7, and 121-8 each mirror the reference current of 20 uA to produce a cur Idac of 80 uA.

At time T4-2, Idac-ref of 40 uA is split between current drive modules 121-4 and 121-5 to produce a reference current of 20 uA. The active current drive modules 121-6, 121-7, 121-8, and 121-9 each mirror the reference current of 20 uA to produce a cur Idac of 80 uA, and so on.

Thus, current Idac-ref is inputted to the Vbias pin of digital-to-analog converter 110 to drain nodes of the transistors in the candidate cells. One or more cells in the digital-to-analog converter 110 are selected as being in the bias mode (bias switch activated to an ON state), splitting the received Idac-ref current (40 microamps) from pin Vbias amongst the selected one or more cells (current drive modules) in the bias state. This current through the one or more selected bias cells associated with the digital-to-analog converter 110 acts a bias reference value. For example, if one cell in the digital-to-analog converter 110 is in the bias state, then the bias reference is 40 microamps; if two cells are in the bias state, then the bias reference is 20 microamps; if three cells are in the bias state, then the bias reference is 13.33 microamps; and so on.

The controller 140 also selects one or more cells to operate in the so-called "active" mode. Each of these active mode cells mirrors the bias reference value determined by the biased cells (i.e., cells in the bias state as previously discussed). For example, assume that 2 cells are biased and the bias reference value is 20 microamps. In such an instance, based on mirroring, if one cell is in the active state, then Idac (sunk by the digital-to-analog converter 110) is 20 microamps; if two cells are in the active state, then Idac is 40 microamps (20×2 active cells); if three cells are in the active state, then Idac is 60 microamps (20×3 active cells); and so on.

Thus, if there were only two cells connected to bias and one connected to active, then the Idac current would be 20 uA. There may be 100 cells (i.e., current drive modules 121-Y) connected to the Vbias node. The controller 140 may select 10 of the 100 current drive modules to produce Idac. As discussed herein, the controller 140 rotates and scrambles which ten of the 100 current drive modules are set to active to mirror the bias current.

Vgn (gate node) is a high impedance input with respect to the digital-to-analog converter 110 because it drives the gate nodes of each of the cells. So, in theory, this is very little current. The current Idac-ref passes through the cells that are set to the bias mode as discussed above.

Additionally, the digital-to-analog converter 110 can be configured to include static cells akin to binary LSB cells which do not change over time that allow you to fine tune the Idac current. If desired, these cells are not shuffled by the controller 140. The LSB cells have less contribution than the other cells, but the controller can be configured to implement cell rotation to improve the drift and linearity error if desired. In this instance, each LSB cell to be added to the cell rotation would require 7 possible connection points, and corresponding 7 switches and extra logic to control the switches.

As previously discussed, shuffling of the dynamic cells (such as selectable as bias mode, active mode, inactive mode) over time helps to reduce a bulk of possible drift errors that would otherwise occur in a static circuit such as in the prior art. One aspect of the digital-to-analog converter 110 as discussed herein is that it includes a candidate pool of current drive modules and corresponding control capability to vary selection of the current drive module modes. So this adds some complexity over conventional techniques. However, the benefit of shuffling (varying selection of which current drive modules are active, varying selection of which current drive modules are biased, varying selection of which current drive modules are in hold mode) is that it reduces the drift problem associated with the conventional static topology, As previously discussed, the controller 140 shuffles which of the cells are set to bias, active, and inactive over time to control the digital-to-analog converter 110 and corresponding current Idac.

FIG. 10 is an example timing diagram supporting compensation as discussed herein.

Timing diagram 1000 illustrates control of operating the error sense tracking and compensation loop 310. To minimize the disturbance to the signal sampled by the loop comparator 315, the controller 140 may swap only one MSB cell connected to the bias leg (receiving Idac-ref) with one MSB cell connected to the hold leg (receiving current Ihold) during the falling edge of clk_dac. As previously discussed, the bias cells generate the 'Vgn' gate voltage, which controls the current of all the cells (a.k.a., current drive modules) in the digital-to-analog converter 110 (a.k.a., VIDDAC array), and thus are allocated the maximum possible time to settle. During the falling edge of 'clk_dac', the error signal 306 at the input of the loop comparator 315 is sampled. In this manner, there is almost 5 ns (the entire clock period) available until the disturbance generated from swapping a bias and hold cell can settle.

Note further that swapping bias cells causes a major disturbance to the vgn node since they generate the bias voltage Vbias for the entire digital-to-analog converter 110 (VIDDAC). Swapping of active cells also generates a disturbance, but with a much smaller magnitude and settles out faster.

If desired, bias cells are may be swapped with 'hold' cells to minimize the disturbance and active cells are only swapped with 'hold' cells to minimize the disturbance.

In that way, bias cell swapping and active cell swapping are decoupled from each other and can be shuffled at different frequencies (different rates).

Figure 11:
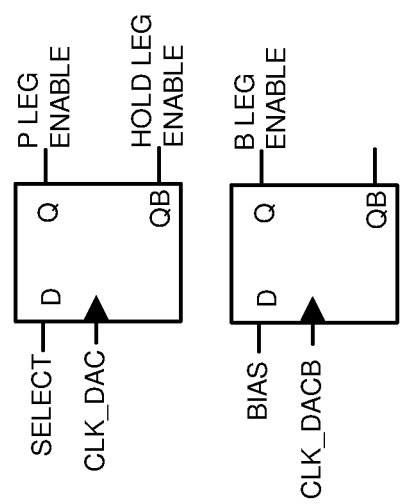
FIG. 11 is an example diagram illustrating latching of control signals to support compensation as discussed herein.

FIG. 11 is an example diagram illustrating latching of control signals for a single current drive module (i.e., cell) to support shuffling operations as discussed herein.

If desired, the controller 140 may, during the rising edge of 'clk_dac,' swap one cell connected to hold with an MSB cell connected to 'vsump' leg. Accordingly, the controller as discussed herein can be configured to delay reconfiguration of switching from a first mode (such as hold) to a second mode (such as active) with respect to a sample clock (i.e., clk-dac) of operating the digital-to-analog converter.

Figure 12:
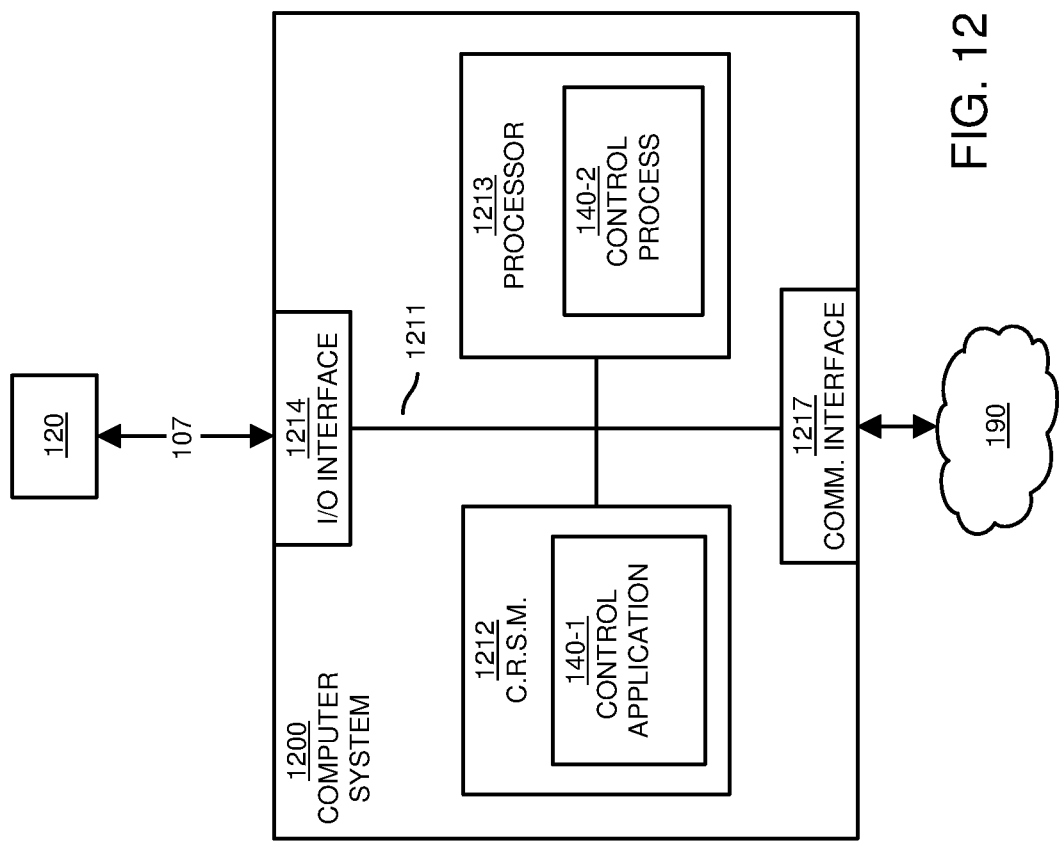
FIG. 12 is an example diagram illustrating computer processor hardware and related software instructions that execute methods according to embodiments herein.

FIG. 12 is an example block diagram of a computer device for implementing any of the operations as discussed herein according to embodiments herein.

As shown, computer system 1200 (such as implemented by controller 140 or other suitable entity) of the present example includes an interconnect 1211 that couples computer readable storage media 1212 such as a non-transitory type of media (or hardware storage media) in which digital information can be stored and retrieved, a processor 1213 (e.g., computer processor hardware such as one or more processor devices), I/O interface 1214, and a communications interface 1217.

I/O interface 1214 provides connectivity to any suitable circuitry such as one or more voltage converters 165.

Computer readable storage medium 1212 can be any hardware storage resource or device such as memory, optical storage, hard drive, floppy disk, etc. In one embodiment, the computer readable storage medium 1212 stores instructions and/or data used by the frequency controller application 340-1 to perform any of the operations as described herein.

Further in this example embodiment, communications interface 1217 enables the computer system 1200 and processor 1213 to communicate over a resource such as network 190 to retrieve information from remote sources and communicate with other computers.

As shown, computer readable storage media 1212 is encoded with controller application 140-1 (e.g., software, firmware, etc.) executed by processor 1213. Controller application 140-1 can be configured to include instructions to implement any of the operations as discussed herein.

During operation of one embodiment, processor 1213 accesses computer readable storage media 1212 via the use of interconnect 1211 in order to launch, run, execute, interpret or otherwise perform the instructions in controller application 140-1 stored on computer readable storage medium 1212.

Execution of the controller application 140-1 produces processing functionality such as controller process 140-2 in processor 1213. In other words, the controller process 140-2 associated with processor 1213 represents one or more aspects of executing controller application 140-1 within or upon the processor 1213 in the computer system 1200.

In accordance with different embodiments, note that computer system 1200 can be a micro-controller device, logic, hardware processor, hybrid analog/digital circuitry, etc., configured to control a power supply and perform any of the operations as described herein.

Functionality supported by the different resources will now be discussed via flowchart in FIG. 13. Note that the steps in the flowcharts below can be executed in any suitable order.

Figure 13:
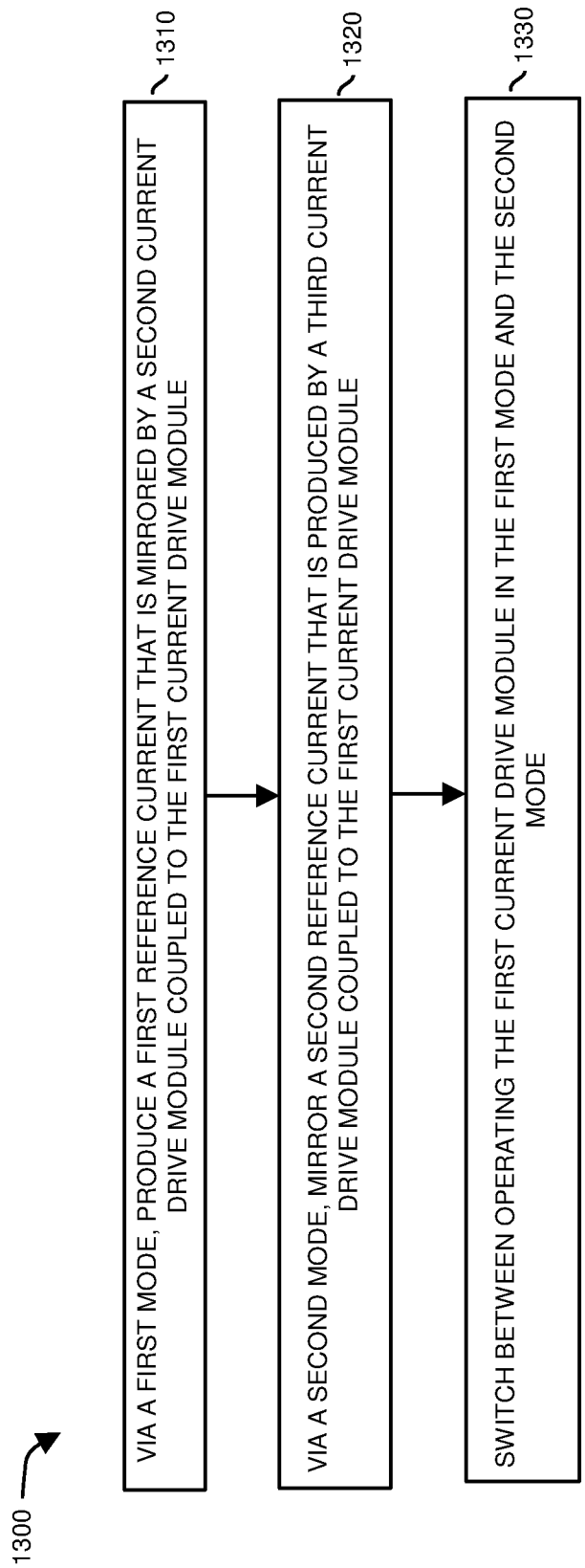
FIG. 13 is an example diagram illustrating a method according to embodiments herein.

FIG. 13 is an example diagram illustrating a method of controlling a power converter according to embodiments herein.

In processing operation 1310, the controller 140 operates current drive modules in a first mode in which current drive module 121-1 produces a first reference current 131-1 that is mirrored (such as copied) by a second current drive module 121-2. The current drive module 121-2 is coupled to the current drive module 121-1.

In processing operation 1320, the controller 140 operates the current drive modules in a second mode in which the first current drive module 121-1 is configured to mirror a second reference current that is produced by a third current drive module 121-3 coupled to the first current drive module 121-1 or the second current drive module 121-2 coupled to the first current drive module 121-1.

In processing operation 1330, over time, the controller 140 switches between operating each of multiple current drive modules between in the first mode and the second mode.

Note again that techniques herein are well suited for use in circuit applications such as those that implement compensation in a power converter. However, it should be noted that embodiments herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

The invention claimed is:

1. An apparatus comprising:
   a first current drive module of a digital-to-analog converter, the first current drive module switchable between:
   i) a first mode of producing a first reference current that is mirrored by a second current drive module coupled to the first current drive module; and
   ii) a second mode of mirroring a second reference current that is produced by a third current drive module coupled to the first current drive module.

2. The apparatus as in claim 1, wherein each of the first current drive module and the second current drive module are operative to receive current supplied from a bias voltage supplying current from error sense circuitry.

3. The apparatus as in claim 1, wherein the first current drive module includes:
   a first mirror transistor; and
   a first bias transistor coupled to the first mirror transistor, the first bias transistor activated to an ON state in the first mode to connect a bias voltage supplying bias current to the first mirror transistor such that the first mirror transistor contributes to producing the first reference current while in the first mode.

4. The apparatus as in claim 3, wherein the first bias transistor is deactivated to an OFF state in the second mode; and wherein the first current drive module further includes a first output transistor coupled to the first mirror transistor, the first output transistor activated to an ON state in the second mode to connect an output node of the digital-to-analog converter to the first mirror transistor such that the first mirror transistor produces a mirror of the second reference current produced by the third current drive module while the first current drive module is in the second mode.

5. The apparatus as in claim 4, wherein the second current drive module includes:
a second output transistor coupled to a second mirror transistor in the second current drive module, a gate of the second mirror transistor coupled to a gate of the first mirror transistor, the second output transistor activated to an ON state while the first current drive module is in the first mode, the activated second output transistor connecting the output node of the digital-to-analog converter to the second mirror transistor such that the second mirror transistor produces a copy of the first reference current while the first current drive module is in the first mode.

6. The apparatus as in claim 1, wherein each of the first current drive module and the second current drive module are operative to receive current supplied from a bias voltage supplying current from error sense circuitry, the first current drive module operative to generate the first reference current from the current supplied from the bias voltage while the first current drive module is in the first mode.

7. The apparatus as in claim 1, wherein the first current drive module is further switchable between the first mode, the second mode, and a third mode; and
wherein the first current drive module does not generate the first reference current or mirror the second reference current while in the third mode.

8. The apparatus as in claim 1 further comprising:
a sequence of multiple current drive modules coupled to each other, the sequence of multiple current drive modules including at least the first current drive module, the second current drive module, and the third current drive module; and
wherein each of the current drive modules in the sequence is switchable between the first mode and the second mode.

9. The apparatus as in claim 8, further comprising:
a controller operative to control the first current drive module in the digital-to-analog converter via at least one thermometer encoded selection signal.

10. The apparatus as in claim 1, wherein the first current drive module includes a first transistor and a second transistor;
wherein the first transistor is set to an ON state and the second transistor is set to an OFF state to select the first mode, the first reference current flowing through the first transistor during the first mode; and
wherein the first transistor is set to an OFF state and the second transistor is set to an ON state to select the second mode, a mirrored rendition of the second reference current flowing through the second transistor during the second mode.

11. The apparatus as in claim 1, wherein the digital-to-analog converter is operative to receive a bias voltage and supply the bias voltage to each of the first current drive module, the second current drive module, and the third current drive module; and wherein a magnitude of the first reference current depends on a number, X, of current drive modules including the first current drive module that are operated in the first mode.

12. The apparatus as in claim 11, wherein the magnitude of the first reference current equals: (a magnitude of Idac-ref)/X, where Idac-ref represents current supplied by the bias voltage.

13. The apparatus as in claim 1 further comprising:
a sequence of multiple current drive modules coupled to each other, the sequence of multiple current drive modules including at least the first current drive module, the second current drive module, and the third current drive module; and
wherein each of the multiple current drive modules in the sequence includes a respective transistor driven and controlled by a common gate drive control signal to support selectable current mirroring amongst the multiple current drive modules.

14. The apparatus as in claim 1 further comprising:
a controller operative to delay reconfiguration of switching from the first mode to the second mode with respect to sampling an error signal produced by error sense circuitry coupled to the digital-to-analog converter, the first current drive module and the second current drive module controlling current though the error sense circuitry.

15. The apparatus as in claim 1, wherein the digital-to-analog converter resides in an error sense tracking loop, the digital-to-analog converter operative to control a magnitude of currents through circuit paths of an error sense circuit of the error sense tracking loop; and
a controller operative to control the magnitude of the current through the error sense circuit via control of a sequence of current drive modules in the digital-to-analog converter, the sequence including at least the first current drive module, the second current drive module, and the third current drive module.

16. The apparatus as in claim 15, wherein the controller is operative to adjust a magnitude of the currents through the error sense circuit over time based on an error signal generated by the error sense circuit, adjustment of the magnitude of the currents based on control of the sequence of current drive modules reducing a magnitude of the error signal.

17. The apparatus as in claim 1, wherein a combination of the first current drive module and the second current drive module is operative to produce an output signal outputted from the digital-to-analog converter.

18. The apparatus as in claim 17 further comprising:
a summer operative to: i) receive the output signal and a feedback signal, the feedback signal indicating a magnitude of an output voltage produced by a power converter, and ii) produce an error signal based upon a difference between the feedback signal and the output signal.

19. The apparatus as in claim 18 further comprising:
a comparator operative to produce a polarity signal indicating a polarity of the error signal based upon comparison of the error signal with respect to a threshold level.

20. The apparatus as in claim 18 further comprising:
a controller operative to produce a first digital signal supplied to the digital-to-analog converter based on the error signal.

21. The apparatus as in claim 1, wherein the digital-to-analog converter resides in an error sense tracking loop.

22. The apparatus as in claim 21, wherein the digital-to-analog converter is operative to control a first magnitude of a first current through a first circuit path of an error sense circuit of the error sense tracking loop; and wherein the digital-to-analog converter is operative to control a second magnitude of a second current through a second circuit path of the error sense circuit of the error sense tracking loop.

23. A method of controlling operation of a first current drive module of a digital-to-analog converter, the method comprising:

controlling the first current drive module to operate in a first mode of producing a first reference current that is mirrored by a second current drive module coupled to the first current drive module; and controlling the first current drive module to operate in a second mode of mirroring a second reference current that is produced by a third current drive module coupled to the first current drive module; and switching between operating the first current drive module in the first mode and the second mode.

24. The method as in claim 23, wherein each of the first current drive module and the second current drive module are operative to receive current supplied from a bias voltage supplying current.

25. The method as in claim 23, wherein the first current drive module is further switchable between the first mode, the second mode, and a third mode in which the first current drive module does not generate the first reference current or mirror the second reference current.

* * * * *